US011461520B1

(12) United States Patent
Chokhani et al.

(10) Patent No.: US 11,461,520 B1
(45) Date of Patent: Oct. 4, 2022

(54) SDD ATPG USING FAULT RULES FILES, SDF AND NODE SLACK FOR TESTING AN IC CHIP

(71) Applicant: Cadence Design Systems, Inc., San Jose, CA (US)

(72) Inventors: Arvind Chokhani, Murphy, TX (US); Joseph Micahel Swenton, Owego, NY (US); Santosh Subhaschandra Malagi, Endicott, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 17/180,239

(22) Filed: Feb. 19, 2021

(51) Int. Cl.
*G06F 30/31* (2020.01)
*G01R 31/3183* (2006.01)
*G06F 30/343* (2020.01)
*G06F 30/323* (2020.01)
*G06F 30/333* (2020.01)
*G06F 30/367* (2020.01)
*G06F 30/398* (2020.01)
*G06F 30/3323* (2020.01)

(52) U.S. Cl.
CPC ....... *G06F 30/31* (2020.01); *G01R 31/31835* (2013.01); *G01R 31/318328* (2013.01); *G06F 30/323* (2020.01); *G06F 30/333* (2020.01); *G06F 30/3323* (2020.01); *G06F 30/343* (2020.01); *G06F 30/367* (2020.01); *G06F 30/398* (2020.01)

(58) Field of Classification Search
CPC ...... G01R 31/31835; G01R 31/318328; G06F 30/31; G06F 30/323; G06F 30/3323; G06F 30/333; G06F 30/343; G06F 30/367; G06F 30/398
See application file for complete search history.

(56) References Cited

U.S. PATENT DOCUMENTS 7,779,381 B2  8/2010  Chickermane et al.
7,925,941 B2  4/2011  Bhatia
(Continued)

OTHER PUBLICATIONS

S. Ho et al., "Automatic test pattern generation for delay defects using timed characteristic functions," 2013 IEEE/ACM International Conference on Computer-Aided Design (ICCAD), San Jose, CA, USA, 2013, pp. 91-98, doi: 10.1109/ICCAD.2013.6691103.
(Continued)

*Primary Examiner* — Jack Chiang
*Assistant Examiner* — Aric Lin
(74) *Attorney, Agent, or Firm* — Tarolli, Sundheim, Covell & Tummino LLP

(57) ABSTRACT

An integrated circuit (IC) test engine extracts an input to output propagation delay for each cell instance of each of a plurality of cell types in an IC design from an SDF file for the IC design. The IC test engine extracts a node slack of each cell instance of each of the plurality of cell types of the IC design from a node slack report. The IC test engine also generates cell-aware test patterns for each cell instance of each cell type in the IC design to test a fabricated IC chip that is based on the IC design for defects corresponding to a subset of a plurality of candidate defects characterized in the plurality of fault rules files. Each cell-aware test pattern is configured to sensitize and propagate a transition along the longest possible path to test small delay defects in cell instances of the fabricated IC chip.

15 Claims, 9 Drawing Sheets

(56) References Cited

U.S. PATENT DOCUMENTS 8,875,077 B1 10/2014 O'Riordan et al.
10,528,692 B1 1/2020 Guo et al.

OTHER PUBLICATIONS

Lin, et al. "Timing-Aware ATPG for High Quality At-speed Testing of Small Delay Defects" Dec. 2006 Proceedings of the Asian Test Symposium 2006:139-146.
Z. Gao, S. Malagi, E. J. Marinissen, J. Swenton, J. Huisken and K. Goossens, "Defect-Location Identification for Cell-Aware Test," 2019 IEEE Latin American Test Symposium (LATS), Santiago, Chile, 2019, pp. 1-6, doi: 10.1109/LATW.2019.8704561.
F. Hapke et al., "Defect-oriented cell-aware ATPG and fault simulation for industrial cell libraries and designs," 2009 International Test Conference, Austin, TX, USA, 2009, pp. 1-10, doi: 10.1109/TEST.2009.5355741.
Sherubha, et al. "Test pattern generation for longest path eliminating SDD using ATPG", International Journal of Engineering Research and Technology(IJERT), ICSEM-2013 Conference Proceedings.
Mattiuzzo, et al. "SDD automatic test-pattern generation breaks the nanometer quality barrier", Test & Measurement World, Jun. 2009.

FIG. 4

SDD ATPG USING FAULT RULES FILES, SDF AND NODE SLACK FOR TESTING AN IC CHIP

TECHNICAL FIELD

This disclosure relates to testing integrated circuit (IC) chips. More particularly, this disclosure relates to generating fault rules files and employing the fault rules files in conjunction with delay information from an SDF file and node slack information to facilitate testing of cell-aware delay defects in an IC chip using SDD ATPG techniques.

BACKGROUND

As IC chip complexity increases, meeting the testing requirements for acceptable quality assurance is becoming increasingly difficult. Automated testing involves applying test signals to each manufactured circuit in various patterns designed to detect defects that cause improper circuit behavior. Although most modern integrated circuits comprise a number of interconnected cells selected from a library, early testing schemes assumed that faults occurred only between cell instances, at the cell I/O ports, or elsewhere outside cells altogether. The test patterns generated therefore did not necessarily include those needed to detect circuit faults inside a cell.

ATPG (acronym for both Automatic Test Pattern Generation and Automatic Test Pattern Generator) is an electronic design automation method/technology used to find an input (or test) sequence that, when applied to a digital circuit, enables automatic test equipment to distinguish between the correct circuit behavior and the faulty circuit behavior caused by defects. The generated patterns are used to test semiconductor devices after manufacture, or to assist with determining the cause of failure. The effectiveness of ATPG systems is measured by the number of modeled defects, or fault models, detectable and by the number of generated patterns. These metrics generally indicate test quality (higher with more fault detections) and test application time (higher with more patterns). ATPG efficiency is another consideration that is influenced by the fault model under consideration, the type of circuit under test (full scan, synchronous sequential, or asynchronous sequential), the level of abstraction used to represent the circuit under test (gate, register-transfer, switch), and the required test quality.

A defect is an error caused in a device during the manufacturing process. A fault model is a mathematical description of how a defect alters design behavior. The logic values observed at the device's primary outputs, while applying a test pattern to some device under test (DUT), are called the output of that test pattern. The output of a test pattern, when testing a fault-free device that works exactly as designed, is called the expected output of that test pattern. A fault is said to be detected by a test pattern if the output of that test pattern, when testing a device that has only that one fault, is different than the expected output. The ATPG process for a targeted fault has two phases: fault activation and fault propagation. Fault activation establishes a signal value at the fault model site that is opposite of the value produced by the fault model. Fault propagation moves the resulting signal value, or fault effect, forward by sensitizing a path from the fault site to a primary output.

A standard cell is a group of transistor and interconnect structures that provides a Boolean logic function (e.g., AND, OR, NOR, NAND, XOR, XNOR, inverters) or a storage function (flipflop or latch). The simplest cells are direct representations of the elemental NAND, NOR, and XOR Boolean function, although cells of much greater complexity are commonly used (such as a 2-bit full-adder, or muxed D-input flipflop). The cell's Boolean logic function is called its logical view: functional behavior is captured in the form of a truth table or Boolean algebra equation (for combinational logic), or a state transition table (for sequential logic).

As IC chips continue to move to smaller geometries and complex components, the existing fault models and test patterns are becoming less effective at ensuring required levels of quality. Concurrently, a growing number of IC chips for certain environments of application is pushing the demand for zero-defect silicon. The main problem with conventional fault models is that conventional fault models only consider faults on cell inputs and outputs and on interconnect lines between these cells. In other words, only faults abstracted to the netlist level are explicitly considered. Cell-aware test overcomes the limitations of conventional fault models and associated test patterns by targeting specific shorts, opens and transistor defects internal to each standard cell. Due to increased complexity and smaller feature sizes testing for fine delay defects or small delay defects (SDDs) is becoming a growing concern in the semiconductor industry. To improve the quality of testing for SDDs, test patterns are generated that employ a longest possible path for testing faults and defects.

Standard Delay Format (SDF) is a textual file format for representing a delay and timing information of electronic systems, such as circuits found in IC chip designs. SDF files are both human and machine readable, and SDF files can be machine written and machine read in support of timing analysis and verification tools, and other tools requiring delay and timing information. The primary audience for this standard is the implementors of tools supporting the format, but anyone with a need to understand the format's contents will find it useful.

A timing report is a textual or a binary file format generated by a timing tool such as STA (Static Timing Analyzer) or other timing analysis engines. Several types of timing reports can be generated. One such timing report can include slack information for each path in an IC design. A path could, for example, be from a source flop to another destination flop. Slack is defined as a difference between a required time for a signal on a given path and an arrival time of the signal on that given path for a given clock period. Another such timing report is a node slack report. A node slack report includes, among other things, the slack on each cell instance of each of a plurality of cell types in an IC design.

SUMMARY

One example relates to a non-transitory machine-readable medium having machine-readable instructions. The machine readable instructions include a fault rules engine that generates a plurality of fault rules files. Each of the fault rules files is associated with a respective cell type of a plurality of cell types in an IC design. Each fault rules file of the plurality of fault rules files includes data quantifying a nominal delay for a given two-cycle test pattern of a set of two-cycle test patterns and data quantifying a delta delay for the given two-cycle test pattern corresponding to a given candidate defect of a plurality of candidate defects of a given cell type of the plurality of cell types in the IC design. The machine readable instructions also include an IC test engine that extracts an input output propagation delay for each cell instance of each of the plurality of cell types in the IC design from an SDF file for the IC design and extracts node slack information for each cell instance of each of the plurality of cell types of the IC design from a node slack report for the IC design. The IC test engine also generates cell-aware test patterns for each cell instance of each cell type in the IC design based on the plurality of fault rules files, the extracted input output propagation delay for each respective cell instance and the node slack information extracted for each cell instance to test a fabricated IC chip that is based on the IC design for defects corresponding to a subset of the plurality of candidate defects characterized in the plurality of fault rules files. Each cell-aware test pattern of the cell-aware test patterns is configured to sensitize and propagate a transition along the longest possible path to test small delay defects in each respective cell instance of the fabricated IC chip.

Another example relates to a system that includes a non-transitory memory that stores machine-readable instructions and a processing unit that accesses the memory and executes the machine-readable instructions. The machine-readable instructions include an IC test engine that extracts an input to output propagation delay for each cell instance of each of a plurality of cell types in an IC design from an SDF file for the IC design and extracts node slack information for each cell instance of each of the plurality of cell types of the IC design from a node slack report for the IC design. The IC test engine employs SDD ATPG techniques to generate cell-aware test patterns for each cell instance of each cell type in the IC design based on a plurality of fault rules files, the extracted input to output propagation delay for each respective cell instance and the extracted node slack information for each cell instance to test a fabricated IC chip that is based on the IC design for defects corresponding to a subset of a plurality of candidate defects characterized in the plurality of fault rules files. Each cell-aware test pattern of the cell-aware test patterns is configured to sensitize and propagate a transition along the longest possible path to test small delay defects in each respective cell instance of the fabricated IC chip. Each of the fault rules files is associated with a respective cell type of a plurality of cell types in an IC design of the fabricated IC chip, and each fault rules file of the plurality of fault rules files comprises data quantifying a nominal delay for a given two-cycle test pattern of a set of two-cycle test patterns and data quantifying a delta delay for the given two-cycle test pattern corresponding to a given candidate defect of a plurality of candidate defects for a given cell type of the plurality of cell types in the IC design.

Yet another example relates to a method for generating a set of test patterns for testing a fabricated IC chip. The method includes extracting, by an IC test engine, an input to output propagation delay for a given cell instance of a given cell type from an SDF file for an IC design for the fabricated IC chip and extracting, by the IC test engine, node slack information for the given cell instance from a node slack report. The method also includes scaling, by the IC test engine, a nominal delay quantified in a fault rules file associated with the given cell type with the input to output propagation delay to determine a scaled nominal delay for the given cell instance. The method further includes calculating, by the IC test engine, a scaled defect size for each of a plurality of candidate defects of the given cell type based on the scaled nominal delay and a delta delay quantified by the fault rules file for each respective candidate defect and the scaled nominal delay. The method yet further includes generating cell-aware test patterns for each of the plurality of candidate defects of the given cell instance based on the scaled nominal delay, the scaled defect size and the node slack information of the given cell instance. Each cell-aware test pattern of the cell-aware test patterns is configured to sensitize and propagate a transition along the longest possible path to test small delay defects in the fabricated IC chip.

BRIEF DESCRIPTION OF THE DRAWINGS

FIG. 4 illustrates an example of a defect detection matrix (DDM) for a cell.

DETAILED DESCRIPTION

Figure 1:
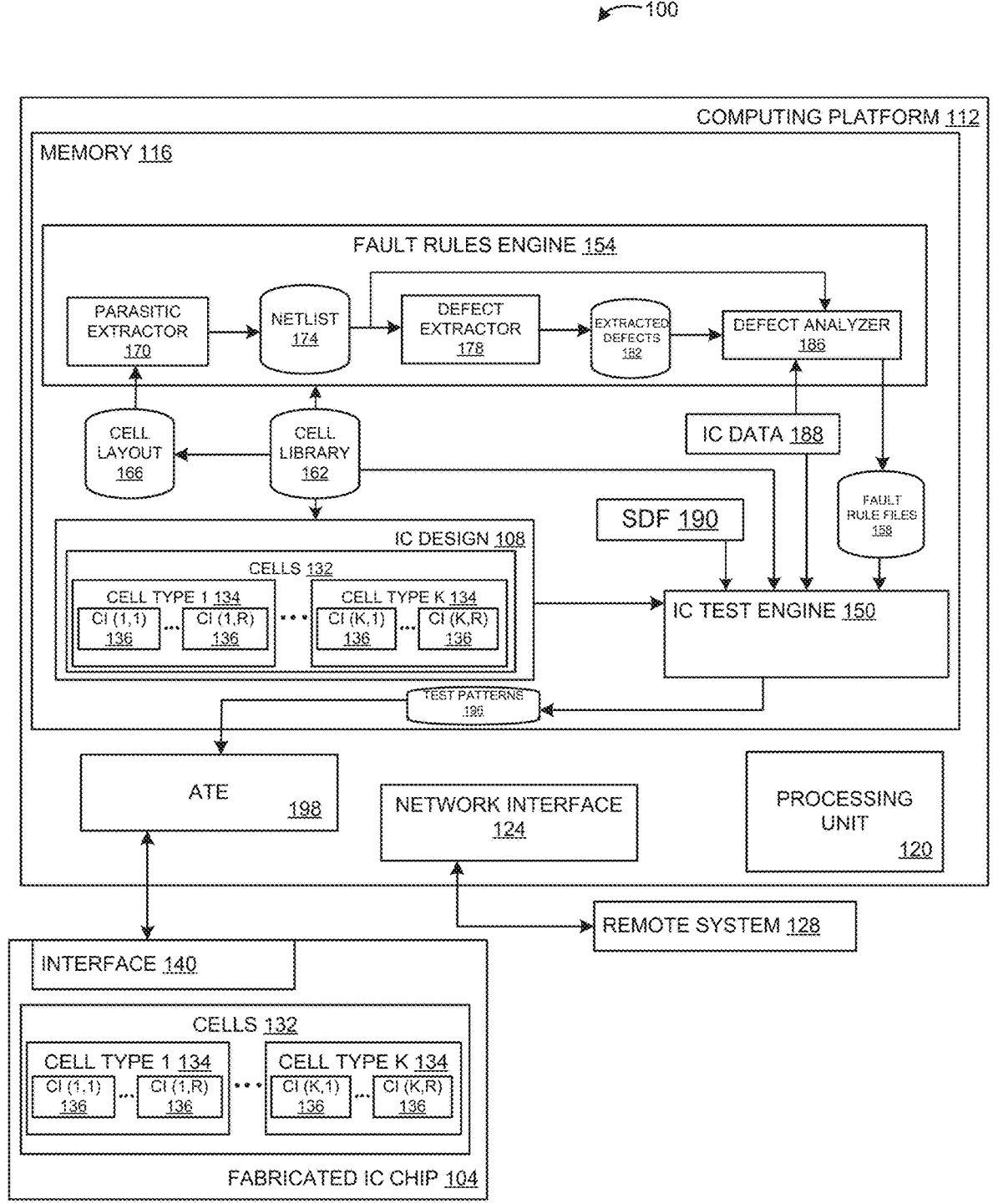
FIG. 1 illustrates an example of a system for testing a fabricated IC chip that is based on an IC design.

This disclosure relates to a system for employing SDD ATPG techniques to generate "cell-aware" test patterns for an IC chip test. A cell-aware test pattern targets candidate defects inside a given library cell, typically those defects that have been extracted from the actual circuit design layout. Such defects can be physically correlated to actual observed fabrication errors, and are therefore of particular interest. For instance, bridge defects that can cause an unintended short or low-resistance connection, and open defects that can cause an unintended disconnection, for example are typically of highest interest. Moreover, test patterns generated with SDD ATPG techniques are selected on a per cell instance basis to employ a longest possible path between a launch node and a capture node for cell instances in an IC design.

The system can include a fault rules engine that generates a plurality of fault rules files for the IC design. Each of the fault rules files is associated with a respective cell type of a plurality of cell types in the IC design. Moreover, each fault rules file includes data (e.g., integers or floating points) quantifying a nominal delay for a given two-cycle test pattern of a set of two-cycle test patterns and data (e.g., integers or floating points) quantifying a delta delay for the given two-cycle test pattern corresponding to a given candidate defect of a plurality of candidate defects located in cells instantiated in the IC design.

The fault rules files are consumable by an IC test engine to generate cell-aware test patterns to test a fabricated IC chip that is based on the IC design. To generate the cell-aware test patterns, the IC test engine extracts information from an SDF file for the IC design that characterizes delay from every element of a path (e.g. clock to output delay of launch flop, interconnect delays, cell delays, etc.). The IC test engine can employ the extracted delay information to calculate the delay of each path in the design.

The IC test engine can additionally employ clock period information extracted from IC data to filter (remove) paths that cannot meet the specified clock period requirement. Such filtered paths may be treated specifically, such as treating them as false paths, to reduce an effect on ATPG coverage. The IC test engine can also extract information from the SDF file for the IC design that characterizes an input to output propagation delay of each cell instance of a plurality of cell types in the circuit design. The IC test engine employs the extracted input to output propagation delays to scale the nominal delay and the defect sizes stored in the fault rules file for each corresponding cell type to determine a scaled nominal delay and defect sizes for each cell instance and generate test patterns for each cell instance of each cell type to test the fabricated IC chip for defects corresponding to a subset of the plurality of candidate defects characterized in the plurality of fault rules files.

Using SDD ATPG techniques, the test patterns generated by the IC test engine aim to detect defects in cell instances by sensitizing and propagating transitions along the longest possible path. The longest possible path refers to a path with the longest delay from a launch node to a capture node, which also indicates that the longest possible path is the path with the worst timing slack. A launch node could be a primary input or a scan flip-flop. A capture node could be a primary output or a scan flip-flop. The IC test engine, employing SDD ATPG techniques, tries to sensitize and propagate a transition through this longest possible path, failing which, the IC test engine tries for the next worst slack path and so forth.

The term "SDD ATPG techniques", as used herein, refers to ATPG techniques where the IC test engine reads in timing information about the IC design in at least one form and targets small delays, instead of gross delays in other ATPG techniques, and generates patterns to test a defect or fault along the longest possible path. Timing information may be available in various formats such as SDF or a timing report (e.g., a node slack report) generated by timing tools such as an STA. The IC test engine can, for example, use the timing information from the SDF file to calculate the delay of all the paths in the IC design, filter out paths which cannot meet a clock period requirement and generate test patterns only for the remaining paths which meet the clock period requirement. Additionally, the test patterns generated using SDD ATPG techniques are configured to use longest possible paths in the IC design to test the small delays caused by defects in each cell instance.

Moreover, in some examples, the filtering of the test patterns or the candidate defects for which to generate ATPG test patterns can include consideration of node slack for each cell instance, as specified in a node slack report, which can be included in IC data. The node slack of each cell instance is based on a worst slack of a timing path through each respective cell instance. In some examples, a timing analysis tool calculates the worst slack on this path and also the corresponding worst slack on each cell instance, which is also referred to as a node.

FIG. 1 illustrates an example of a system 100 for testing a fabricated IC chip 104 that is based on an IC design 108. The system 100 can include a computing platform 112. Accordingly, the computing platform 112 can include a memory 116 for storing machined readable instructions and data and a processing unit 120 for accessing the memory 116 and executing the machine-readable instructions. The memory 116 represents a non-transitory machine-readable memory (or other medium), such as random access memory (RAM), a solid state drive, a hard disk drive or a combination thereof. The processing unit 120 can be implemented as one or more processor cores. The computing platform 112 can include a network interface 124 (e.g., a network interface card) configured to communicate with other computing platforms via a network, such as a public network (e.g., the Internet), a private network (e.g., a local area network (LAN)) or a combination thereof (e.g., a virtual private network).

The computing platform 112 could be implemented in a computing cloud. In such a situation, features of the computing platform 112, such as the processing unit 120, the network interface 124, and the memory 116 could be representative of a single instance of hardware or multiple instances of hardware with applications executing across the multiple of instances (i.e., distributed) of hardware (e.g., computers, routers, memory, processors, or a combination thereof). Alternatively, the computing platform 112 could be implemented on a single dedicated server or workstation.

The IC design 108 can be stored in the memory 116 of the computing platform 112. The IC design 108 can be implemented, for example, as design specifications for an IC chip. The IC design 108 can be generated with an electronic design automation (EDA) application operating on a remote system 128, such as a logic synthesis application (e.g., a synthesis tool). For instance, an end-user of the EDA application can employ a user-interface to generate and/or modify hardware description language (HDL) code (e.g., Verilog) for generating a register-transfer level (RTL) model (e.g., RTL code) characterizing a circuit, wherein the RTL model is transformable by an EDA application into a physically realizable gate-level netlist for the IC design 108.

As noted, in the examples described, the fabricated IC chip 104 represents a physically instantiated version of the IC design 108. More particularly, the fabricated IC chip 104 and the IC design 108 can include intellectual property (IP) blocks formed of cells 132. Each of the cells 132 (alternatively referred to as standard cells), can represent a group of transistor and interconnect structures that provides a Boolean logic function (e.g., AND, OR, NOR, NAND, XOR, XNOR, inverters) or a storage function (e.g., flipflop or latch). The cells 132 of the fabricated IC chip 104 represent physically instantiated versions of the cells 132 of the IC design 108. Thus, the cells 132 of the IC design 108 and the cells 132 of the fabricated IC chip 104 employ the same reference numbers. In many instances, there can be virtually any number of cells 132 (e.g., hundreds, thousands or millions).

In the present example, there are K number of different cell types 134 of the cells 132, where K is an integer greater than or equal to one. Additionally, there are R number of cell instances 136 for each of the K number of cell types 134, where R is an integer greater than or equal to one. Each cell instance 136 represents a specific instantiation in the IC design 108 for a corresponding cell type 134. Moreover, there can be a different (or the same) number of cell instances 136 for each of the K number of cell types 134.

For purposes of simplification of explanation, each of the cell instances 136 includes a unique identifier implemented as a two-dimensional index number, i,j, where i identifies the cell type 134 and j identifies the cell instance number for the cell type 134. For instance, the cell instance 136 labeled as CI (1,R) uniquely identifies the Rth cell instance of cell type 1. Similarly, the cell instance 136 labeled as CI (K,1) uniquely identifies the first cell instance 136 of the Kth cell type 134.

The fabricated IC chip 104 can include an interface 140 that enables external systems to provide stimuli to the components of the fabricated IC chip 104, including the cells 132 of the fabricated IC chip 104. The interface 140 can conform to the standards set forth in the IEEE 1149.1 standards, IEEE 1149.6 standards, and can be implemented with PCI, wafer probes, etc.

The memory 116 includes an IC test engine 150 which can be implemented as application software or a software module. The IC test engine 150 is configured to generate and execute employ SDD ATPG techniques to generate cell-aware, timed transition test patterns that can be applied to the fabricated IC chip 104 to ensure proper operation, and each time transition test pattern is configured to employ a longest possible path between a launch node and a capture node for each respective cell instance 136.

The IC test engine 150 can operate in concert with a fault rules engine 154 stored in the memory 116. The fault rules engine 154 can be configured/programmed to generate fault rules files 158. In some examples, the fault rules engine 154 generates Defect Detection Matrices (DDMs) that each represents a user-readable format of a corresponding fault rules file 158. Each fault rule file 158 represents a set of fault rules for a particular cell type 134 of the K number of cell types 134 that is selected from a cell library 162. The cell library 162 can include, but is not limited to, data characterizing a physical layout of each of the K number of cell types 134 in the cells 132 of the IC design 108 and the fabricated IC chip 104. The cell library 162 can also include structural Verilog (.v), behavioral Verilog (.v) and timing models (.lib).

To generate the fault rule files 158, the fault rules engine 154 can read a cell layout 166 from the cell library 162. The cell layout 166 corresponds to a physical layout view of the standard cell 134 in terms of mask polygons containing the geometrical data required to fabricate the IC chip 104. The fault rules engine 154 generates a particular fault rule file 158 of the fault rule files 158 based on the cell identified in the cell layout 166.

The fault rules engine 154 can represent a plurality of software applications that operate in an ordered sequence to generate each instance of the fault rule files 158. In particular, the cell layout 166 can be received by a parasitic extractor 170. The parasitic extractor 170 generates a transistor-level netlist 174 of the cell represented by the cell layout 166. The parasitic extractor 170 utilizes the layout information 166, along with other fabrication technology-related information available in the cell-library 162 to generate the transistor level netlist 174. The netlist 174 is a textual description of the standard-cell 134 in terms of its designed devices (i.e. transistors), input output pins and their inter-connections. The netlist 174 also includes un-avoidable parasitic resistors (Rs) and capacitors (Cs) inherent to a standard-cell 134 extracted by the parasitic extractor 170. The parasitic resistors, for example, can be extracted on the wires and inter-connects and for the terminals of a transistor e.g. drain, gate, source, bulk. The parasitic extractor 170 can extract parasitic capacitors between wires on the same layer (intra-layer), between layers (inter-layer) or across transistor terminals e.g. drain-gate, drain-source, bulk-drain, etc. The netlist 174 can be provided in the Detailed Standard Parasitic Format (DSPF).

The fault rules engine 154 can include a defect extractor 178 that can analyze the netlist 174 to identify parasitic resistors and capacitors to be modeled as potential open and short defects for the standard-cell 134 to provide extracted defects 182. The extracted defects 182 can include data for modeling each of the defects identified in the netlist 174. For instance, a large parasitic resistor indicates a long and thin wire segment that can undergo an unintended break, and hence is a potential 'open' defect site. A large parasitic capacitance between two nets or wire segments indicates that the two nets or wires are relatively close to one another and along a relatively long distance, hence can be potentially shorted. An open defect is modeled with a high ohmic resistance (e.g. 1 G Ohm), and a short is modeled with a very low resistance (e.g., 0.001 Ohm).

The extracted defects 182 from the netlist 174 can be provided to a defect analyzer 186 that characterizes each of the extracted defects 182 in the netlist 174. More particularly, the defect analyzer 186 simulates operation of a circuit representing the cell layout 166 for each instance of the extracted defects 182. For example, the defect analyzer 186 can simulate operation of the circuit representing a particular cell with each parasitic capacitor and/or resistor being set to a defect free value, and open or a short. The defect analyzer 186 can identify transition defects as well as static defects in one of the K number of cell types 134 characterized by the cell layout 166. Transition defects characterize defects wherein a component within the cell reaches an expected value slower than is acceptable. Conversely, static defects refer to defects that cause a circuit component to not reach an expected value within the typically used tester cycle period (e.g. 20 ns for a 50 MHz tester cycle). Throughout this disclosure, unless otherwise noted the defects analyzed by the defect analyzer 186 refer to a combination of transition defects and static defects.

The defect analyzer 186 outputs an instance of the fault rule file 158 based on the results of the analysis. The fault rules file 158 can include data that quantifies a nominal delay for the particular cell and a delta delay caused by each defect analyzed, which analyzed defects can be referred to as candidate defects. The fault rules engine 154 can repeat operations to iteratively generate the fault rules files 158 for each cell type 134 in the K number of cell types 134.

Additionally, in some examples, IC data 188 that is stored in the memory 116 can include information characterizing selectable attributes of the IC design 108, and this information can be provided to the defect analyzer 186. In some examples, the IC data 188 (or some portion thereof) can be provided, in response to user input. For instance, the selectable attributes for IC data 188 (if included) can be generated during or after the IC design 108 is being generated. The IC data 188 can include information for each of the K number of cell types 134 or some subset thereof. This information can include, for example, an input slew rate and an output load for each of the K number of cell types 134 in the cells 132. The input slew rate and output load can be based, for example, on a-priori knowledge of delay paths in the IC design 108. Moreover, as noted, there can be multiple instantiations of each of the K number of cell types 134 of the cells 132 that each have different path delays. In these situations, one input slew rate and output load is provided for each of the K number of cell types 134 of the cells 132 or some subset thereof. In some examples, the input slew rate and output load can be based on an average path delay of each of the K number of cell types 134 of the cells 132. In some examples, the input slew rate and/or output load for a subset of the K number of cell types 134 may be omitted. In such a situation, the defect analyzer 186 can select a default input slew rate and/or a default output load for the subset of the K number of cell types 134.

To facilitate understanding of the operations of the fault rules engine 154, a given extended example ("the given example") is provided and explained with respect to FIGS.

2-5. The given example illustrates and describes how a fault rules file can be generated for an AND gate cell.

Figure 2:
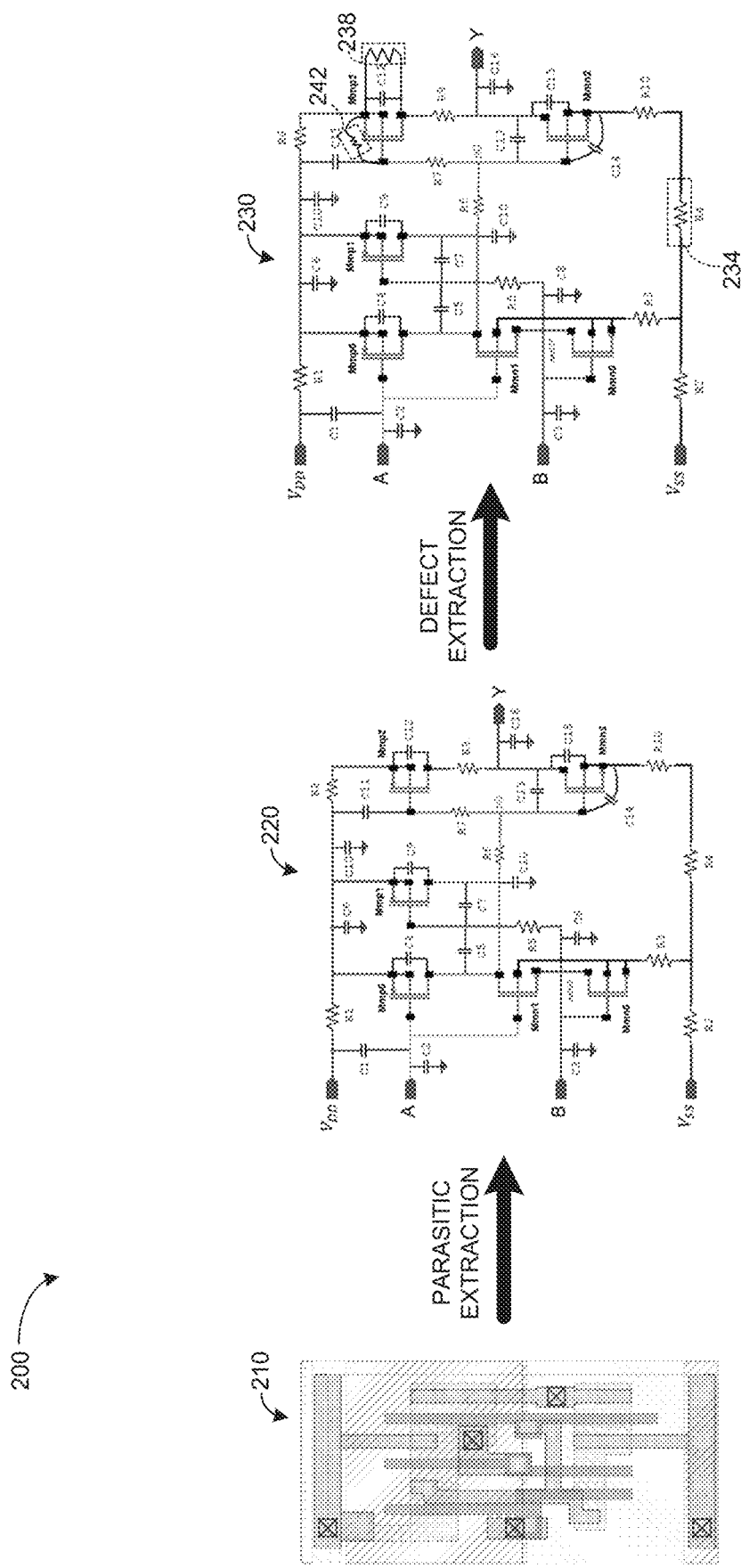
FIG. 2 illustrates diagrams depicting a flow for extracting potential defects in a cell.

FIG. 2 includes diagrams depicting a flow 200 for extracting potential defects in a cell in the given example. FIG. 2 includes a cell layout 210 for an AND gate. The physical cell layout 210 characterizes the physical layout of an IC chip that physically instantiates the AND gate. More particularly, the physical cell layout 210 includes connection points and traces that form the AND gate.

A parasitic extractor, such as the parasitic extractor 170 of FIG. 1 can analyze the physical cell layout 210 to generate a transistor-level netlist of the cell layout 210. The transistor-level netlist provides data sufficient to generate a circuit diagram 220 for the physical cell layout 210. The parasitic extractor analyzes the netlist to identify and extract parasitic components in the cell represented by the circuit diagram 220. These parasitic resistors and capacitors are not intended by the designer of the cell, but exist in a fabricated IC chip that employs the cell. Parasitic capacitance, or stray capacitance is an unavoidable (and usually unwanted) capacitance that exists because of a proximity of circuit components, such as wires, interconnects between transistor terminals, etc. Similarly, all conductors (e.g. wires, interconnects) in the cell layout 210 possess some unavoidable parasitic resistance. The parasitic extractor extracts (or models) these parasitic resistors and capacitors in the circuit diagram 220. In this manner, the parasitic extractor generates an accurate analog model for the physical cell layout 210 that is characterized in the circuit diagram 220, which analog model is employable to emulate circuit responses in detailed simulations of the circuit diagram 220.

The parasitic extractor identifies (marks) node in the netlist with the parasitic components that coincide with possible defect sites. Thus, the parasitic extractor augments the netlist with data that includes the identification of parasitics extracted from the netlist. In the given example, the parasitic extractor analyzes the circuit diagram 220 to provide a circuit diagram 230 that includes specific identification of a resistor R4 234 in the netlist as a parasitic component.

The netlist in DSPF that identifies parasitics can be provided to a defect extractor, such as the defect extractor 178 of FIG. 1. The defect extractor employs the parasitics identified in the netlist to model potential open and short defects within a standard cell. More particularly, the defect extractor can analyze the identified parasitics and generate a fault model for each identified parasitic in the netlist, or some subset thereof. Additionally, the defect extractor searches the circuit diagram 220 to identify nets that are relatively long which could form a parasitic resistor and/or nets that are relatively close and running parallel over long distance, which could form a parasitic capacitor. These parasitic capacitors have a high probability of corresponding to probable short and open locations as a result of defects induced during fabrication. That is, the defect extractor can identify locations in the netlist that have a higher probability of corresponding to manufacturing defects.

The fault model for each parasitic resistor can represent an instance of a circuit design wherein a respective parasitic resistor is modeled as an open (e.g. a resistor with a resistance of 1 G Ohm). Examples of such modeled opens can include, but are not limited to, opens at a drain, gate, source and bulk terminals on FETs, and opens on each branch of interconnected nets including signaling nets and between power-ground nets. Additionally, the fault model for each parasitic capacitor can be represented as an instance of the circuit design wherein a respective parasitic capacitor is modeled as a short (e.g., a resistor with a resistance of 0.001 Ohm). The examples of such modeled shorts can include, but are not limited to shorts across FET terminal pairs, including drain-source, drain-gate, source-gate, bulk-drain, bulk-gate and bulk-source pairs. The examples of such model shorts also include shorts across each possible interconnected net pairs, signal nets on the same layer (e.g., intralayer shorts), shorts between power-ground nets (e.g., power-ground shorts) and shorts between adjacent layers (e.g., inter-layer shorts). The defect extractor can provide extracted defects, such as the extracted defects 182 of FIG. 1 that identifies the location of defects modeled by the defect extractor. In the given example, the resistor R4 234 can be modeled as an open circuit in one fault model of the circuit design. In another fault model of the circuit design, the capacitor C12 238 or the transistor terminals of MMP2 242 can be modeled as a short. That is, the defect extractor generates multiple versions of a circuit representing a cell, wherein each version (a fault model) includes an open or a short replacing a particular parasitic resistor or parasitic capacitor. Each of the fault models can be aggregated into the extracted defects that can be provided to a defect analyzer, such as the defect analyzer 186 of FIG. 1.

The defect analyzer can employ the extracted defects characterized with fault models to generate a DDM and a fault rule file that characterizes a detectability of each fault identified in the netlist, or some subset thereof. More particularly, the defect analyzer can employ transient fault analysis to generate the DDM and the fault rule file for the cell. In the given example, it is presumed that there are 41 potential faults. The defect analyzer applies a set of two-cycle test patterns for each potential fault to determine whether a fault is detectable, and if the fault is detectable, to determine if the fault is a static defect or a transient fault. Moreover, if the fault is a transient fault, the defect analyzer identifies a defect delay percentage that represents a deviation from a nominal delay characterized by a defect-free version of a cell.

In the given example, the circuit diagram 220 includes input nodes labeled A and B and an output node labeled Y. As noted, in the given example, the cell represents an AND gate. Thus, an instance of the cell with no defects should provide an output of a logical one on node Y if, and only if nodes A and B have a logical one applied there-on. Additionally, node Y should output a logical 0 for all other combinations of logical values applied to nodes A and B. To generate the DDM and the fault rule file, the defect analyzer simulates instantiations of the cell that have particular defects and analyzes whether a particular defect impacts an output of a cell based on the application of two-cycle test patterns applied to the input nodes (nodes A and B in the given example).

Figure 3A:
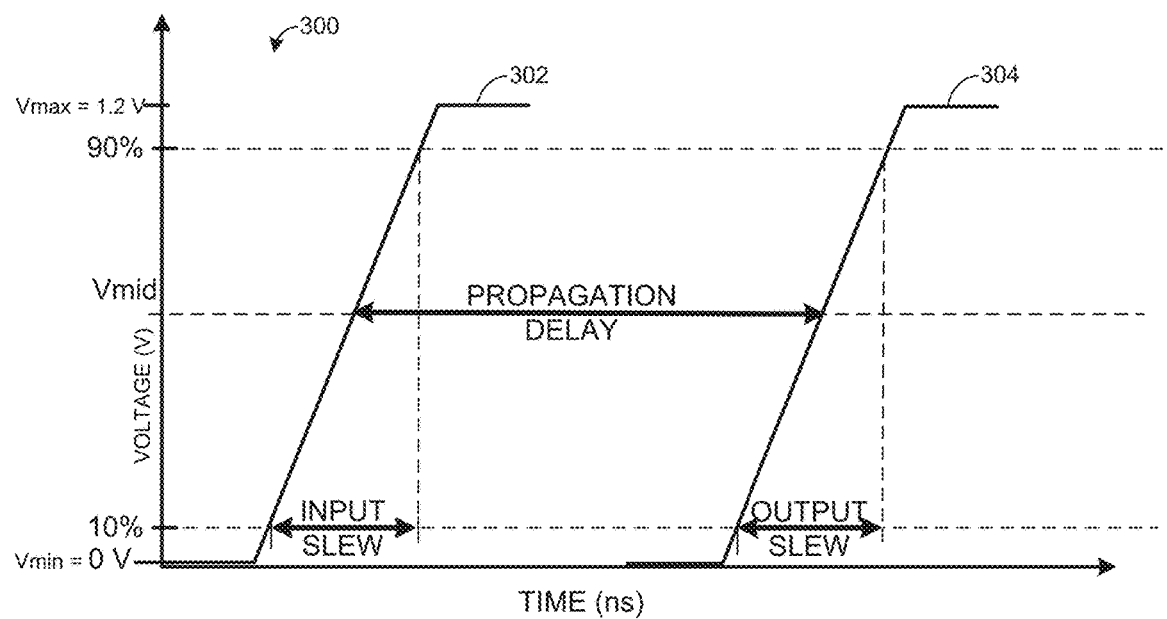
FIG. 3A illustrates a timing diagram depicting measuring propagation delay in a cell.

FIG. 3A illustrates a timing diagram 300 that demonstrates a measurement of propagation delay for a cell, such as the AND gate in the given example. The timing diagram 300 plots an input signal 302 and an output signal 304 for the cell. The input signal can represent a signal of a test pattern at an input node of the cell, and the output signal 304 can represent the response to the test pattern. The timing diagram 300 plots voltage (V) as a function of time in nanoseconds (ns). In the timing diagram 300, it is presumed that a voltage of 1.2 V coincides with Vmax and 0 V coincides with Vmin. Therefore, the midpoint voltage of Vmid is 0.6 V. In other examples, the value of Vmax may be different for various technologies such that Vmid would change accordingly.

As noted, in some examples IC data, such as the IC data 188 of FIG. 1 includes an input slew rate and an output load for each cell type 134 or some subset thereof. In such a situation, the output load for a given cell type can be employed to calculate an output slew. The input slew provided in the IC data defines a time interval during a rising edge (or falling edge, in other examples) of the input signal 302 where the input signal 302 transitions from 10% of Vmax (0.12 V) and 90% of Vmax (1.08 V). Similarly, the output slew (calculated from the output load) defines a time interval during a rising edge (or falling edge, in other examples) of the output signal 304 where the output signal transitions from 10% of Vmax (0.12 V) and 90% of Vmax (1.08 V). Moreover, the propagation delay for the cell is a time interval between a time that the input signal 302 crosses the midpoint voltage, Vmid, and a time that the output signal 304 crosses the midpoint voltage, Vmid. If the IC data omits an input slew rate and output load for a particular cell type, the defect analyzer selects a default input slew rate and an output load for each (or every) cell type 134 of the IC design 108 of FIG. 1.

Figure 3B:
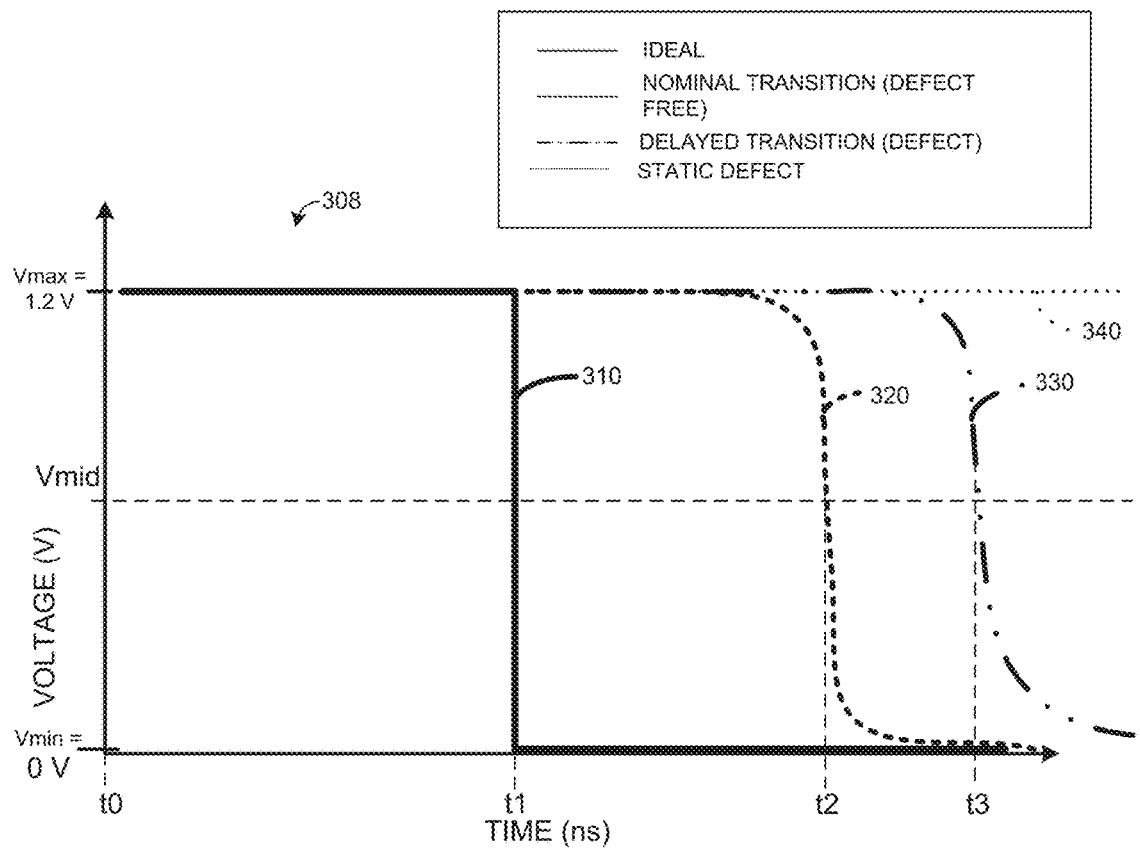
FIG. 3B illustrates a timing diagram depicting an application of a two-cycle test pattern for a cell.

FIG. 3B illustrates a timing diagram 308 depicting an application of a two-cycle test pattern for a cell. Similar to FIG. 3A, the timing diagram plots voltage (V) as a function of time in nanoseconds (ns). The defect analyzer employs the two-cycle test pattern to measure a response (output) to two different test patterns, namely a first test pattern and a second test pattern, as well as a time delay for a change in the response.

Continuing with the given example, a first plot 310 of the timing diagram 300 plots the response of an ideal circuit representing the circuit diagram 220 for a cell of FIG. 2. In the ideal circuit, the output node, Y changes instantaneously in response to a change in a signal at the input nodes, A and B. A second plot 320 of the timing diagram 300 plots a simulated response of a defect free version of the circuit representing the circuit diagram 220 for cell of FIG. 2. A third plot 330 of the timing diagram 300 plots a simulated response of the circuit diagram 230 for a cell of FIG. 2 wherein a fault model is applied, such that the circuit includes a candidate defect that causes a transition delay. A fourth plot 340 of the timing diagram 300 plots a simulated response of the circuit diagram 230 of FIG. 2 wherein another fault model is applied that causes a static defect. For purposes of simplification of explanation, it is presumed that the third plot 330 represents the circuit diagram 230 for a cell where the parasitic resistor R3 234 is modeled as an open, and the fourth plot 340 represents the circuit diagram 230 where the parasitic capacitor C12 238 is modeled as a short.

In the given example, it is presumed that from time t0 to time t1 (e.g., a time interval of about 500 ps) that a first test pattern of the two-cycle test pattern applies a logical 1 to node A, a logical 1 to node B, such that the expected (defect free) response is an output of a logical 1 on node Y. Additionally, in the given example, it is presumed that from time t1 onward that a second, test pattern of the two-cycle test applies a logical 0 to node A and a logical 1 to node B, such that the expected (defect free) response is an output of a logical 0 on node Y.

Similar to the timing diagram 300, in the timing diagram 308, it is presumed that a voltage of 1.2 V coincides with Vmax and 0 V coincides with Vmin. Therefore, the midpoint voltage of Vmid is 0.6 V. In other examples, the value of Vmax may be different for various technologies such that Vmid would change accordingly. Accordingly, during the time interval between t0 and t1, the first plot 310 representing the ideal circuit version of the cell, the second plot 320 representing a defect-free version of the cell and the third plot 330 representing a version of the cell with a candidate defect causing a delayed transition (specifically, modeling resistor R4 234 as an open), each plot provides a voltage above the midpoint voltage, Vmid (e.g., a voltage of about 1.2 V), such that the first plot 310, the second plot 320 and the third plot 330 each represent the output node, Y outputting a logical 1 in the given example. Conversely, the fourth plot 340 representing the cell with the parasitic capacitor C12 238 modeled as a short, outputs a voltage below the midpoint voltage, Vmid (e.g., a voltage of about 0 V) such that the fourth plot 340 represents the output node, Y outputting a logical 1.

In the timing diagram 300, as noted, from time t1 onward, it is presumed that the second test pattern is applied. As illustrated, at time t1, the first plot 310 representing an ideal circuit version of the cell instantaneously reduces to 0.0 V, thereby representing a logical 0 on the output node, Y in the given example. Additionally, the second plot 320 representing a defect free version of the cell, transitions from 1.2 V to the midpoint voltage, Vmid from time t1 until time t2. The third plot 330 representing the cell with a candidate defect causing a transition delay, transitions from 1.2 V to the midpoint voltage, Vmid from time t1 until time t3 (wherein t3 is later than t2). Moreover, the fourth plot 340, representing the cell with a static defect remains constant at 1.2 V and does not respond to the change in the test pattern. Thus, the defect analyzer can record the candidate defect modeled by the fourth plot 340 as a static defect.

The time interval between times t1 and t2 corresponds to the propagation delay in the timing diagram 300. That is, the time interval between times t1 and t2 corresponds to a time interval between a time that an input signal crossed the midpoint voltage, Vmid and an output signal (e.g., the second plot 320 representing the defect free version of the cell) crosses the midpoint voltage, Vmid in response to the change at the input signal. The defect analyzer measures and records this time interval as nominal delay, $Delay_{nom}$ for the cell for the two-cycle test pattern applied. Similarly, the time interval between times t1 and t3 corresponds to a time interval between a time that the input signal crossed the midpoint voltage, Vmid and the output signal (e.g., the third plot 330 representing the cell with the candidate defect causing the transition delay) crosses the midpoint voltage, Vmid in response to the change at the input signal. The defect analyzer records this time interval as a defect delay, $Delay_{fn}$ that is caused by the particular candidate defect represented by the third plot 330 (e.g., setting the resistor R4 234 of FIG. 2 to an open in the given example). The defect analyzer can employ Equation 1 to calculate and record a delta delay, $Delay_{\Delta}$, that represents a change, in percentage of delay that is caused by the inclusion of the candidate defect modeled in the third plot 330 for the two-cycle test pattern applied.

$$Delay_{\Delta} = \frac{Delay_{fn} - Delay_{nom}}{Delay_{nom}} * 100 \qquad \text{Equation 1}$$

The defect analyzer can be configured to apply multiple two-cycle test patterns for each candidate defect identified in the netlist. The results can be aggregated to form a DDM and a fault rules file for the cell. Additionally, as indicated by the timing diagram 300, the input slew and/or the output load selected by the defect analyzer can impact the nominal delay, $Delay_{nom}$ and the delta delay, $Delay_\Delta$.

Figure 4:
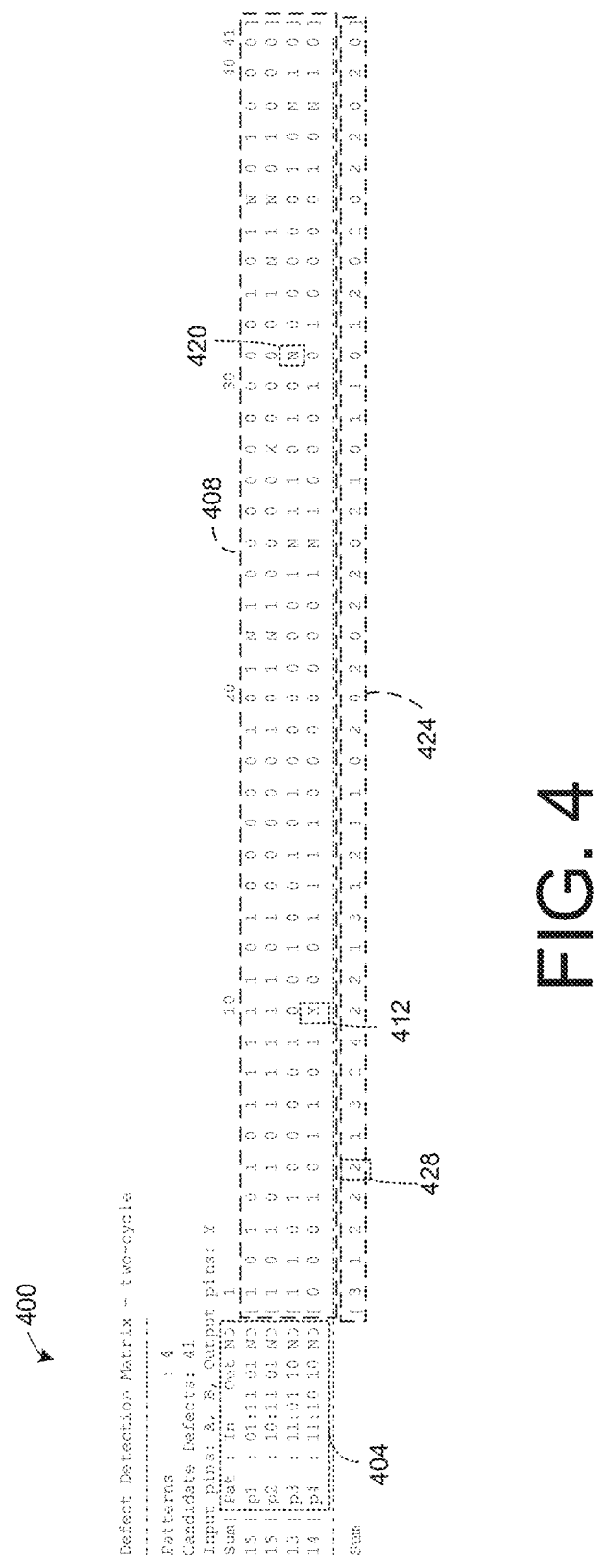

FIG. 4 illustrates an example of a DDM that could represent the cell (an AND gate) in the given example. In the DDM 400, a first box 404 identifies and characterizes four two-cycle test patterns, labeled p1 . . . p4. For instance, in the given example, the two-cycle test pattern p1 is labeled as (In) 01:11, (Out) 01 and (ND) "ND". This labeling indicates that in a first test pattern, a logical 0 is applied to node A, and a logical 1 is applied to node B, and that an expected response at the output node, Y is a logical 0. Additionally, this labeling also indicates that in a second test pattern, a logical 1 is applied to node A and to node B, and that the expected response at the output node, Y is a logical 1. Furthermore, the labeling "ND" of p1 represents a recorded nominal delay, $Delay_{nom}$ for the test pattern, p1 (e.g., the transition delay for a defect-free version of the cell). Values at "ND" are stored as integer or floating point values.

Additionally, the DDM 400 includes a 41 by 4 results matrix 408 wherein each of the 41 columns represents a recorded result of a corresponding two-cycle test pattern for a particular candidate defect. That is, each column represents a response to four two-cycle test patterns, p1 . . . p4 by a particular version of the cell where one defect is modeled. Values in the results matrix 408 of the DDM 400 recorded as a 0 indicate that the particular defect did not have a detectable change on the operation of a cell for a corresponding test pattern. For instance, the value stored in the results matrix 408 at column 3, row 3 indicates that the two-cycle test pattern p3 (11:01; 10; "ND") in the first box 404 has a value of 0. This indicates that the two-cycle test pattern, p3 is not employable to detect the particular candidate defect modeled in column 3.

Additionally, values in the results matrix 408 of the DDM 400 recorded as a 1 indicate that the particular defect is a static defect detected by the corresponding test pattern. For instance, the value stored at column 4, row 4 indicates that the two-cycle test pattern p4 (11:10; 10; "ND") has a value of 1. This indicates that the two-cycle test pattern, p4 is employable to detect static defect for the particular candidate defect model in column 4.

A recorded value of 'X' in the results matrix 408 indicates that the corresponding test pattern is not employable to detect a defect caused by the candidate defect of the corresponding column due to non-convergence, where the solution from fault analysis was indeterminant. Furthermore, in the given example, the value at column 10, row 4 in a second box labeled 412 is set to 'X', indicating that due to non-convergence, two-cycle test pattern p4 is not employable to detect a defect caused by the particular candidate defect modeled in column 10.

Further, a recorded value of 'N' represents a percent deviation from a corresponding nominal delay 'ND' caused by applying a corresponding test pattern for a particular candidate defect. The 'N' is recorded as a floating point or integer number in the results matrix 408 of the DDM 400. For instance, a fourth box 420 around a value at column 31, row 3 is set to 'N'. In one example, suppose the value at the fourth box 420 is set to a value of "20.4". This would indicate that for test pattern, p3 (11:01; 10; "ND"), the candidate defect represented in column 31 causes a detectable delay of 20.4% relative to the nominal delay value stored as "ND" for p4 in the first box 404. Accordingly, the DDM 400 not only identifies transition delays caused by candidate defects of the cell, but also quantifies the amount of delay caused by the candidate defects (recorded as values 'N').

The DDM 400 also includes a one row sum matrix 424 that stores integer values characterizing a number of test patterns p1 . . . p4 that are employable to detect a particular defect. For instance, in a fifth box 428, a value of 2 is stored at column 5 of the one row sum matrix 424 of the DDM 400. This value indicates that two different two-cycle tests (namely p1 and p2) are employable to detect the candidate defect modeled in column 5.

As noted, the defect analyzer generates a fault rules file that corresponds to the DDM. The fault rules file provides similar information as the DDM in a format consumable by an IC test engine, such as the IC test engine 150 of FIG. 1.

Referring back to FIG. 1, the fault rules files 158 for each of the K number of cell types 134 of the cells 132 included in the IC design 108 are provided to the IC test engine 150 for the generation of cell-aware test patterns for the fabricated IC chip 104 using SDD ATPG techniques.

Additionally, the memory 116 can also store an SDF file 190 for the IC design 108. The SDF file 190 can be generated, for example, with timing analysis tools or engines. In some examples, these timing analysis tools can be implemented as a stand-alone software application. In other examples, these timing analysis tools can be integrated with another application, such as an EDA application that generated the IC design 108. In some examples, the SDF file 190 can be provided with the IC design 108 (e.g., by the remote system 128). In other examples, the SDF file 190 can be provided separately.

In some examples, the SDF file 190 can be generated, based on corner case timing analysis of the IC design 108. Corner cases refer to operational conditions that are at or near a maximum range of specifications. For instance, the SDF file 190 can represent corner case simulations of selected process corner variations, voltage corner variations or temperature corner variations of the IC design 108.

The SDF file 190 can include delay information for each cell instance 136 of the cells 132 in the IC design 108. More specifically, the SDF file 190 includes delay information for each of the R number of cell instances 136 of each of the K number of cell types 134. The delay information provided by the SDF file 190 can include, but is not limited to input to output propagation delay (which can be referred to as propagation delay), (or multiple propagation delays) for each cell instance 136 in the IC design 108. The propagation delay for each cell instance 136 may be from an input to an output duplet, and for each input transition. For example, the propagation delay for a given cell instance 136 can specify a value quantifying an input A to output Z delay for the given cell instance 136 when input value A transitions from 0 to 1.

The IC data 188 can also include a node slack report (e.g., a particular type of timing report) for the IC design 108. The node slack report is a textual or a binary file format generated by a timing tool such as STA. The node slack report included in the IC data 188 can contain slack information for each path in the IC design 108, such as a path from a source flop to another destination flop. The node slack report can include the slack on each cell instance 136 of each of the plurality of cell types 134 in the IC design 108. A minimum worst slack on each cell instance 136 (node) is employable as a factor in determining a defect size for each respective cell instance 136 that could or could not be detected.

The IC test engine 150 can employ SDD ATPG techniques to generate cell-aware test patterns for the fabricated IC chip 104 based on the fault rules files 158, the IC design 108, the SDF file 190 and the node slack report extractable from the IC data 188. The test-patterns are considered "cell-aware" because the cell-aware test patterns are generated based on candidate defects within boundaries of the cells 132 of the IC design 108. That is, rather than conventional test patterns that treat each cell as a "black box", the cell-aware test patterns that are generated by the IC test engine 150 are tailored for specific defect candidates that are possible based on the internal circuit design of cells. Moreover, the SDD ATPG techniques generate test patterns that launch and propagate transitions through the longest possible path, from a launch node to a capture node, to test small delay defects in cell instances 136. Moreover, the SDD ATPG techniques generate test patterns that launch and propagate transitions through the longest possible path from a launch node to a capture node, to test small delay defects in cell instances 136. For example, the IC test engine 150 can employ the propagation delay information extracted from the SDF file 190 to calculate the path delays of each of the possible multiple paths between a launch node and a capture node and generate cell-aware delay ATPG test pattern targeting the path with the longest of these delays, failing which, the IC test engine 150 targets the next longest path and so forth.

The IC test engine 150 can examine the fault rules files 158 and the SDF file 190 to generate tailored test patterns for each cell instance 136 in the IC design 108. As noted, the fault rules files 158 include a nominal delay for each cell type 134 and each applicable two-cycle test pattern and the SDF file 190 can include a propagation delay for each cell instance 136. The IC test engine 150 can be configured such that for each cell instance 136, the IC test engine 150 employs the propagation delay as specified in the SDF file 190 to scale the nominal delay specified in the corresponding fault rules file 158 for each test pattern associated with a respective cell instance 136 and determine a scaled nominal delay for each cell instance 136, or some subset thereof.

To demonstrate this concept, consider a situation where the IC test engine 150 generates a test pattern for the Rth instance of cell type K, namely the cell instance labeled CI (K,R) 136. In this situation, the IC test engine 150 can retrieve the fault rules file 158 that corresponds to the Kth cell type 134. As illustrated by the DDM 400 of FIG. 4, the fault rules file 158 for the Kth cell type 134 includes nominal delays for each test pattern and delta delays for particular candidate defects. To generate the test patterns for the cell instance (K,R) 136, the IC test engine 150 can employ the propagation delay specified in the SDF file 190 for the cell instance (K,R) 136 to scale the nominal delays listed in the fault rules file 158 for the Kth cell type 134. Additionally, the delta delay, Delay$_A$, specified in the corresponding fault rules file 158 can be employed to determine a scaled defect size for candidate defects of the cell instance (K,R) 136.

Continuing with this example, suppose that the fault rules file 158 for cell type K 134 specifies a nominal delay, Delay$_{nom}$ of 0.3 ns (300 ps) for a given test pattern and that a given candidate defect has a delta delay, Delay$_A$, of 20% for the given test pattern. Additionally, suppose that the SDF file 190 specifies a propagation delay of 0.4 ns (400 ps) for the cell instance (K,R) 136. In this situation, the IC test engine 150 can generate a test pattern for cell instance (K,R) 136 that has a scaled nominal delay of 0.4 ns (400 ps) and scales the defect size for the candidate defect to 0.48 ns (480 ps) which is 20% greater than the scaled nominal delay for the cell instance (K,R) 136. That is, the resultant test pattern can test for the candidate defect determining if the cell instance (K,R) 136 in the fabricated IC chip 104 has a delay of 0.48 ns (480 ps) indicating that the candidate defect is present in the fabricated IC chip 104. In this manner, the cell-aware test patterns are tuned for the particular characteristics of each cell instance 136 of the IC design 108.

Further, in some examples, the IC data 188 can include information characterizing a minimum defect size, a maximum defect size or a range of defect sizes. For instance, the IC data 188 may specify that the fabricated IC chip 104 is to be tested for defects that cause a delay of 0.5 ns (500 ps) or more. The minimum defect size, the maximum defect size and the range of defect sizes can be based, for example, on the environment of implementation for the fabricated IC chip 104. In this situation, the IC test engine 150 can filter (remove) the candidate defects for which to generate ATPG test patterns or filter (remove) test patterns that test for candidate defects that cause a transition delay of less than 0.5 ns (500 ps). Such filtering of test patterns reduces the number of cell-aware test patterns needed to test the fabricated IC chip 104. Alternatively, in some examples, the IC data 188 may omit the information related to defect sizes (the minimum defect size the maximum defect size and the range of defect sizes). In such a situation, the IC test engine 150 can employ the nominal delay from the fault rule files 158, the propagation delay from the SDF file 190, and node slack information for each cell instance 136 to filter undetectable defects automatically.

Figure 5A:
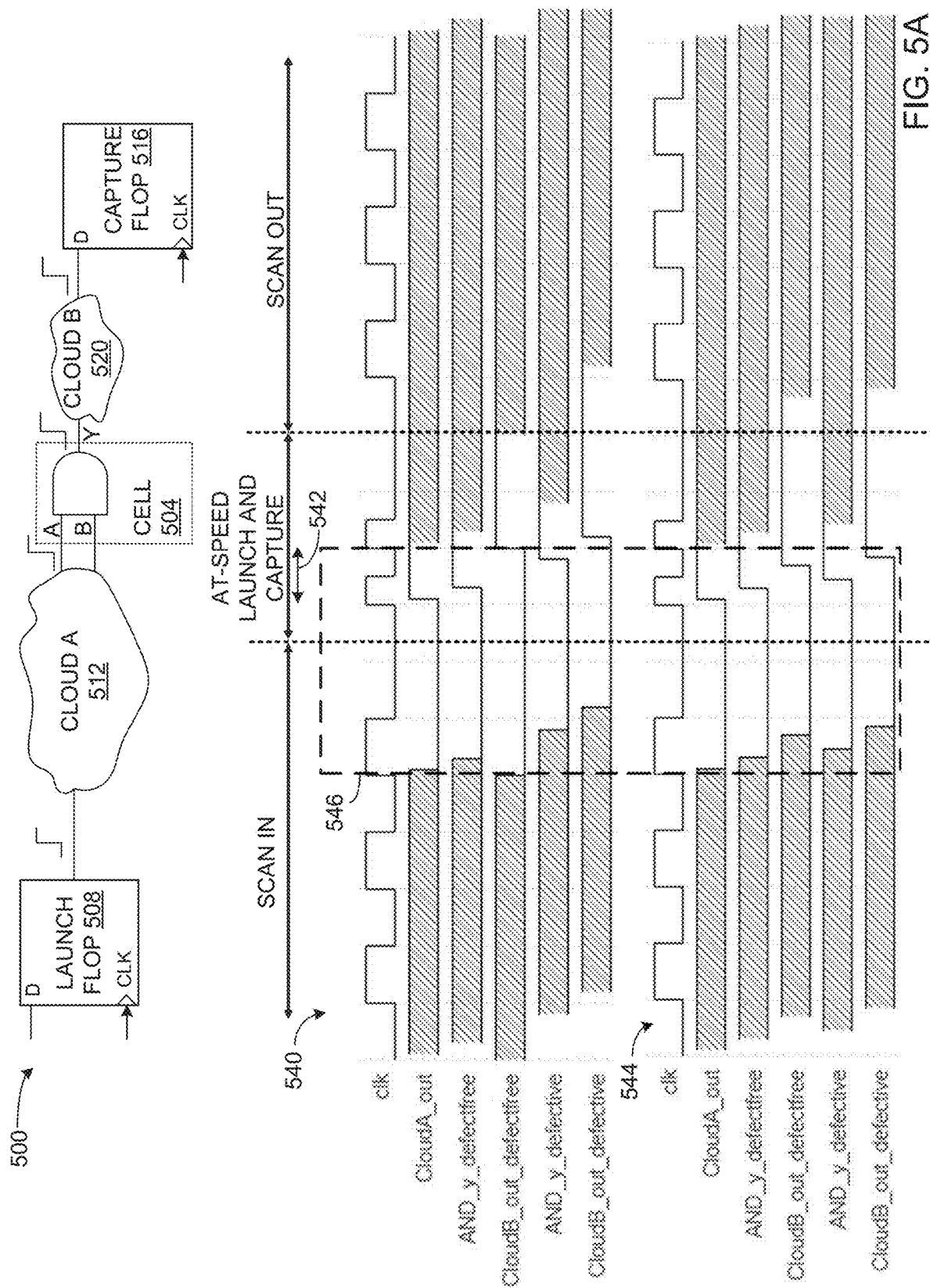
FIG. 5A illustrates a diagram of a testing structure and timing diagrams for associated signals for a cell.
Figure 5B:
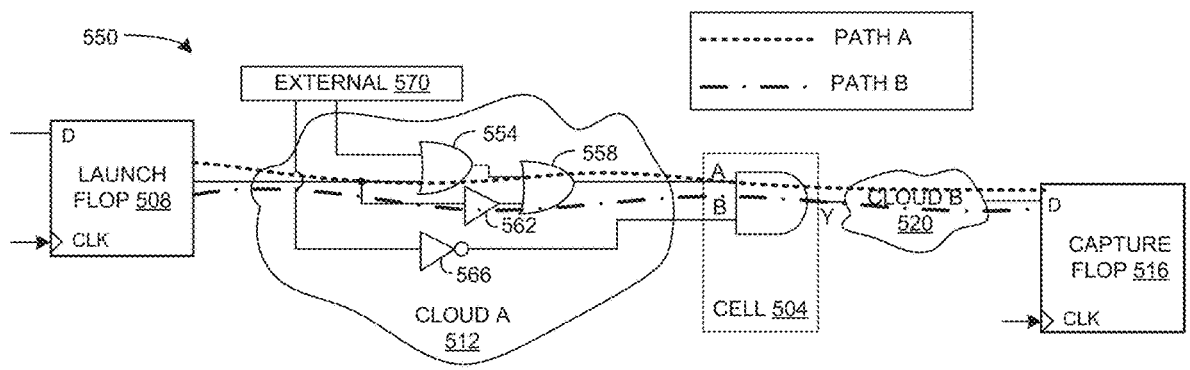
FIG. 5B illustrates a specific instantiation of a testing structure for a cell.

More particularly as noted, generation and the filtering of the test patterns can include consideration of the node slack for each cell instance 136, as specified in the node slack report of the IC data 188. The node slack of each cell instance 136 is based on respective path delays. Different instances of the same cell type 134 (e.g., cell instance (1,1) and cell instance (1,2)) can have different path delays based on a location of each respective cell instance 136. Furthermore, by employing the SDD ATPG techniques, each test pattern for each respective cell instance 136 employs a longest possible path through the respective cell instance 136 for a given launch node and a given capture node in the IC design 108. FIGS. 5A and 5B demonstrate the impact of node slack on filtering of test patterns or candidate defects for ATPG.

FIG. 5A illustrates a simplified circuit diagram 500 illustrating a simplified example of a testing structure for a cell 504, a corresponding first timing diagram 540 and a corresponding second timing diagram 544. The cell 504 is employable as one of the K number of cell types 134 of FIG. 1. More particularly, the cell 504 represents an AND gate, consistent with the given example. The circuit diagram 500 also includes a launch flop 508 that is configured to apply a test pattern to the cell 504. A first cone of logic labeled "cloud A" 512 is coupled between the launch flop 508 and the cell 504. Cloud A 512 is upstream from the cell 504, and is coupled to input nodes, A and B of the cell 504 in the given example.

A capture flop 516 is configured to capture an output response provided by the cell 504. The capture flop 516 can be implemented, for example, as a D flip-flop. Moreover, although the circuit diagram 500 illustrates a single launch flop 508 and a single capture flop 516, in other examples, there could be multiple instances of the launch flop 508 and/or the capture flop 516 that operate in concert to apply test patterns. In the given example, the capture flop 516 captures an output response of the cell 504, such as node Y in the given example. A second cone of logic labeled as "cloud B" 520 is coupled between the capture flop 516 and the cell 504.

Path delays of cloud A 512 and cloud B 520 can impact the testability of the cell 504. For instance, the internal configuration of cloud A 512 can impact an input slew rate of the cell 504 and the internal configuration of cloud B can impact an output load of the cell 504. Referring back to FIG. 1, the information related to input slew rate and output load of the cell instance 136 (illustrated in FIG. 5) is not available during cell-aware defect characterization executed by the defect analyzer 186 because defect characterization employed to generate the fault rules files 158 is executed in a standalone manner for each cell type 134 in the cell library 162. In some examples, the defect characterization is executed by the defect analyzer 186 once (and only once) before the particular IC design 108 is designed using the cell library 162. Additionally, the defect characterization by the defect analyzer 186 is executed under some assumed (default or average) input slew and output load for each cell type 134 cell in the cell library 162. However, as explained, each of the K number of cell types 134 of the IC design 108 can have R number of cell instances 136 in the IC design 108, and each cell instance 136 of each cell type 134 could potentially have a different input slew rate and/or output load.

Moreover, because the cell characterization process executed by the defect analyzer 186 is agnostic of specific design information for the IC design 108 propagation delay information from the SDF file 190 from each cell instance 136 that is employed to scale the nominal delay in the corresponding fault rules file 158 allows a more accurate estimate of the propagation delay and delay caused by a defect for each respective cell instance 136. In contrast to the fault rules files 158, the SDF file 190 is specific to the IC design 108 and provides more accurate delay information about each cell instance 135 in the IC design 108.

Referring again to FIG. 5A, the first timing diagram 540 and the second timing diagram 544 are included to illustrate an impact of path delays on the circuit. To illustrate the impact of the path delays, the first timing diagram 540 and the second timing diagram 544 are plotted on the same time scale. In the first timing diagram 540 and the second timing diagram 544, a clock signal, CLK has a frequency of 1 gigahertz (GHz), which could be specified in the SDF file 190. Moreover, the first timing diagram 540 and the second timing diagram 544 represent timing diagrams for different instantiations of the circuit diagram 500 (e.g., different cell instances of the same cell type) where the path delay across cloud B 520 is different. As one example, the first timing diagram 540 could represent cell instance (1,1) 136 of FIG. 1 and the second timing diagram 544 could represent cell instance (1,R) 136 of FIG. 1. More particularly, the first timing diagram 540 represents a situation where a path (e.g., a critical path) for testing the cell 504 has the worst path slack of 0 ps. The second timing diagram 544 represents a situation where the path (e.g., the critical path) for testing the cell 504 has a worst path slack of 300 ps.

Slack in terms of a circuit design, including an IC design, defines a difference between a required arrival time and the (actual) arrival time for a signal using a path from a source to a destination. The source can be a primary input pin or flop (also sometimes referred to as a register or flip-flop) and destination may be a primary output or flop. Thus, in some examples, there are four (4) types of paths: (i) primary input to primary output, (ii) primary input to flop, (iii) flop to flop and (iv) flop to primary output. The required arrival time defines a latest time that a signal is permitted to arrive at the given destination and comply with the clock frequency of the IC design.

Thus, the arrival time at the destination defines a maximum of arrival times for preceding (upstream) nodes of the given node plus a delay from the given node. The required arrival time to the given node is the minimum of the required arrival times at the preceding nodes minus a delay to the given node. For a given source and destination duplet, there may be multiple paths and hence, multiple slacks. The worst slack or the smallest slack is of most interest. Unless otherwise noted, the examples of node slack are considered positive node slack.

The first timing diagram 540 and the second timing diagram 544 each include three regions, a scan in region, labeled "SCAN IN", an at-speed launch and capture region, labeled "AT-SPEED LAUNCH AND CAPTURE" and a scan out region, labeled "SCAN OUT". In the scan in region, a test pattern is scanned into a circuit represented by the circuit diagram 500. In the at-speed launch and capture region, a first at-speed pulse creates the transition needed on the output of the launch flop 508. This transition needs to propagate through the Cloud A 512, through the AND cell 504 and through the Cloud B 520 to the capture flop 516 within the specified clock period where an output of the Cloud B 520 can be captured. In the scan out region, the output response captured by the capture flop 516 is read.

As noted, each of the first timing diagram 540 and the second timing diagram 544 plot the same signals, which correspond to different instantiations of the circuit diagram 500 (e.g., different cell instances 136 of the same cell type 134). More particularly, the first timing diagram 540 and the second timing diagram 544 each include the clock signal, CLK, and output of cloud A 512, CloudA_out, an output of a defect free version of the cell 504, AND_y_defectfree and an output of cloud B 520, response to the AND_y_defectfree signal, CloudB_out_defectfree. Stated differently, the CloudB_out_defectfree represents an output of Cloud B 520 when the output of the cell 504 is modeled with a defect free version of the cell 504. Furthermore, the first timing diagram 540 and the second timing diagram 544 also include an output of a fault model version of the cell 504, AND_y_defective and an output of cloud B 520 response to AND_y_defective signal, CloudB_out_defective. Stated differently, the CloudB_out_defective represents an output of Cloud B 520 when the output of cell 504 is modeled with a fault model version of the cell 504 corresponding to a candidate defect. Accordingly, the defect modeled by the AND_y_defective signal in the timing diagram 560 is not detectable due to the 300 ps slack.

The at-speed capture region includes a functional clock period 542 that defines one period of the clock signal, CLK. In the example illustrated, the functional clock period 542 is a time from a first rising clock edge of the clock, CLK to a second rising edge of the clock signal, CLK that is after the transition to the at-speed launch and capture region. The first timing diagram 540 and the second timing diagram 544 also includes a region of interest 546. The region of interest 546 defines a time interval from a last rising edge of the clock signal, CLK in the scan in region before the transition to the at-speed capture region until the end of the functional clock period 542.

As noted, the first timing diagram 540 represents a situation where a path (e.g., a critical path) for testing the cell 504 has a node slack of 0 ps. With a slack of 0 ps, the CloudB_out_defectfree signal is captured by the capture flop 516 at the same time as a second rising edge of the clock signal, CLK corresponding to an end of the functional clock period 542. Thus, with a node slack of 0 ps, delay over a nominal delay of the cell 504 (which nominal delay is represented by AND_y_defectfree) would cause the capture flop 516 to capture an incorrect value, such that a defect causing this delay would be testable with the applied test pattern. For instance, as demonstrated in the first timing diagram 540, the AND_y_defective signal causes a greater amount of delay than the nominal delay, Delay$_{nom}$ indicated by the AND_y_defectfree signal. This delay (corresponding to a delta delay, Delay$_A$) is propagated to the cloud B 520, such that CloudB_out_defective has a rising edge after termination of the region of interest 546.

Additionally as noted, the second timing diagram 544 represents a situation where a path (e.g., a critical path) for testing the cell 504 has a slack of 300 ps. With a slack of 300 ps, the CloudB_out_defectfree signal has a rising edge at 300 ps before the CloudB_out_defectfree signal is captured by the capture flop 516 (corresponding to the end of the functional clock period 542). Thus, with a slack of 300 ps, a delay of more than 300 ps than a nominal delay of the cell 504 (which nominal delay is represented by AND_y_defectfree) would cause the capture flop 516 to capture an incorrect value, such that a defect causing this delay (nominal delay+300 ps) would be testable with the applied test pattern. In the second timing diagram 544, the AND_y_defective signal causes a delay that is greater than the nominal delay, but less than the sum of the nominal delay and the slack of 300 ps, as indicated by the AND_y_defectfree signal. This delay (corresponding to a delta delay, Delay$_A$) is propagated to the cloud B 520, such that CloudB_out_defective has a rising edge before termination of the region of interest 546. Accordingly, the defect modeled by the AND_y_defective signal in the timing diagram 560 is not detectable due to the 300 ps slack.

In comparing the first timing diagram 540 and the second timing diagram 544, inclusion of node slack changes a minimum detectable delay size. In particular, as illustrated by the second timing diagram 544 defects that cause delays less than 300 ps more than the nominal delay are not detectable by the test pattern. Stated differently, the greater the node slack of a circuit path, the less sensitive the circuit path is to delay defects, which in-turn reduces the testability of such defects.

FIG. 5B illustrates a circuit diagram 550 with a specific instantiation of the circuit diagram 500 of FIG. 5A. Thus, for purposes of simplification of explanation, FIGS. 5A and 5B employ the same reference numbers to denote the same structure. The circuit diagram 550 illustrates an example of multiple path delays through the cell 504 for the launch flop 508 and the capture flop 516, and how SDD ATPG techniques are employed to determine the longest possible path between a launch node (the launch flop 508) and a capture node (the capture flop 516), and how node slack impacts testability of cell-aware delay defects in cell 504.

More particularly, the cell 504, implemented as an AND gate for the given example is driven by cloud A 512. In the circuit diagram 550, there are two paths from the launch flop 508 through the cell 504 and to the capture flop 516, namely path A and path B. Moreover, although the circuit diagram 550 includes one launch flop 508 and one capture flop 516, in other examples, there could be more launch flops 508 and/or more capture flops 516. Path A and path B each traverse a different number of circuit components within cloud A 512. Thus, path A and path B each have a different delay and hence a different slack. In the present example, path A is the longest path and path B is the shortest path. Accordingly, the circuit diagram 550 demonstrates how the same cell, namely cell 504 can have different path delays. An IC test engine, such as the IC test engine 150 of FIG. 1 can employ SDD ATPG techniques to generate test patterns for the cell 504 that employ the longest path through the cell 504, namely path A in the circuit diagram 550. More particularly, test patterns generated for the cell 504 with SDD APTG techniques employs a longest path (path A) for a given launch node 508 and capture node 516 in the IC design 108 to test cell-aware delay defects in cell 504. To further this example, the SDD ATPG techniques could employ the shorter path (path B) to test delay cell-aware defects for some other cell instance (for example an inverter 566 in cloud A 512) for which path B may be the longest path through that cell instance.

In the circuit diagram 550, Cloud A 512 includes a first OR gate 554, a second OR gate 558, a buffer 562 and the inverter 566 (a NOT gate). Path A corresponds to the path from the launch flop 508, that traverses the first OR gate 554, the second OR gate 558 and is input to the cell 504 at node A. Path B corresponds to the path from the launch flop 508, that traverses the buffer 562, the second OR gate 558 and is input to the cell 504 at node A. An external circuit 570 is coupled to an input of the first OR gate 554 and to an input of the inverter 566. As an example operation, consider a situation where the external circuit 570 outputs a logical 0 and the launch flop initially outputs a logical 1. In this situation, the output of the cell 504 is a logical 1, which is propagated to the capture flop 516. Continuing with this example, in a situation where the launch flop 508 transitions from outputting the logical 1 to a logical 0, the output of the buffer 562 transitions to a logical 0 before the output of the first OR gate 554 transitions to a logical 0, because the path delay on path A is greater than the path delay on path B. However, the output of the second OR gate 558, which is coupled to node A of the cell 504, transitions from a logical 1 to a logical 0 after the output of the first OR gate 554 along path A also transitions from a logical 1 to a logical 0. Accordingly, the specific instantiation of Cloud A 512 allows signals output from the launch flop 508 to propagate along path A, the longest path between the launch flop 508 and the capture flop 512. In other instantiations, other stimuli may be needed to propagate signals along the longest path between the launch flop 508 and the capture flop 512.

In the circuit diagram 550, signal delays along path A that are caused by defects in the cell 504 are detectable if the delay is greater than the node slack for the cell 504 (the worst slack from the launch flop 508 through the cell 504 and to the capture flop 516). In other words, signal delays along path A that are caused by defects in the cell 504 are detectable if the delay is greater than the worst slack from the launch flop 508 through the cell 504 and to the capture flop 516. Accordingly, if a signal along path A is delayed by more than the node slack for a cell instance, a defect of cell 504 that caused the delay is detectable with a test pattern. For instance, suppose the node slack for the cell 504 is 0.2 ns (200 ps), which also indicates the slack for path A is 0.2 ns (200 ps). Also, suppose that the slack of path B is 0.5 ns (500 ps). In this situation, defects of the cell 504 that cause a delay less than 0.2 ns (200 ps) cannot be detected either by path A or path B. Hence, defects in the cell 504 which cause a delay less than 0.2 ns (200 ps), the node slack of cell 504, can be removed from the candidate defects targeted by the IC test engine (e.g., the IC test engine 150 of FIG. 1).

Additionally, continuing with this example, defects of the cell 504 that cause a delay of signals along path A that is more than the node slack of path A, which is 0.2 ns (200 ps) in the present example, are detectable. Further, defects of the cell 504 that cause a delay of signals along path B by more than the slack of path B, which is 0.5 ns (500 ps) in the present example are detectable. Accordingly, smaller candidate defects of the cell 504 are detectable with test patterns that employ path A than test patterns that employ path B.

Thus, by employing SDD ATPG techniques that employ the longest possible path, path A of the circuit diagram 550, the quality of the test pattern is improved relative to a test pattern that employs path B.

Referring back to FIG. 1, the IC test engine 150 can examine each cell instance 136 to determine which, if any, test patterns and/or candidate defects should be filtered based on the node slack specified by the node slack report of the IC data 188. For instance, in one example, the IC data 188 can specify that the node slack of a given cell instance 136 in the fabricated IC chip 104 is 0.5 ns (500 ps). In this situation, the IC test engine 150 can filter (remove) test patterns for candidate defects on this cell instance 136 with a defect delay size of 0.5 ns (500 ps) or less. Accordingly, in situations where the scaled defect delay size for a given candidate defect that is calculated for a specific cell instance 136 is less than the 0.5 ns (500 ps) node slack on the given cell instance 136, the IC test engine 150 can filter (remove) the test patterns for the candidate defect. Additionally, or alternatively, such filtering can remove particular candidate defects for which to generate test patterns for particular cell instances 136 that have a scaled defect delay size less than the node slack specified in the IC data 188.

The IC test engine 150 can employ the SDD ATPG techniques to generate cell-aware test patterns 196 for the fabricated IC chip 104. These SDD ATPG techniques generate timed transition test patterns that try to ensure that each test pattern of the cell-aware test patterns 196 uses a longest possible path between a launch node and a capture node to detect defects in each cell instance 136. More particularly, the SDD ATPG techniques sensitize and propagate a transition through this longest possible path. In the event that the IC test engine 150 fails to sensitize and propagate a transition through this longest possible path, the SDD ATPG techniques cause the IC test engine 150 to try for the next worst slack path and so forth. The example illustrated in FIG. 5B depicts an example of multiple paths through a particular cell instance 504. Selection of test patterns that employ the longest possible path improves the quality of the test patterns by increasing the probability that small delay defects in cell instances 136 are detected in the fabricated IC chip 104.

Additionally, the IC test engine 150 can examine the node slack of each cell instance 136 to determine which, if any, test patterns and/or candidate defects should be filtered based on the minimum defect delay size specified by the IC data 192. As noted above, in one example, the IC data 192 may specify that the fabricated IC chip 104 is to be tested for defects that cause a delay of 0.5 ns (500 ps) or more. In this situation, the IC test engine 150 can filter (remove) test patterns for candidate defects with a defect delay size of 0.5 ns (500 ps) or less. Accordingly, in situations where the scaled defect delay size, for a given candidate defect, that is calculated for a specific cell instance 136 is less than 500 ps, the IC test engine 150 can filter (remove) the test patterns for the candidate defect. Additionally, or alternatively, such filtering can remove particular candidate defects for which to generate test patterns for particular cell instances 136 that have a scaled defect delay size less than the minimum defect delay size specified in the IC data 188.

As an example of the impact of filtering test patterns based on information included in the node slack timing report specified in the IC data 188, suppose that the SDF file 190 specifies that cell instance (K,1) 136 has an input A to output Z propagation delay of 0.2 ns (200 ps) and that cell instance (K,R) 136 has an input A to output Z propagation delay of 0.4 ns (400 ps) when input A transitions from 0 to 1 causing output Z to transition from 0 to 1 as well. Further, suppose that the fault rules file 158 for cell type K 134 has a nominal delay, $Delay_{nom}$ of 0.35 ns (350 ps) and a delta delay, Delay of 20% for a given candidate defect which can be detected by a given test pattern requiring input A to transition from 0 to 1 and defect free output Z to transition from 0 to 1. Based on the propagation delay specified in the SDF file 190 for the cell instance (K,1) 136, the scaled nominal delay for the cell instance (K,1) 136 is determined to be 0.2 ns (200 ps) and the scaled nominal delay for the cell instance (K,R) 136 is determined to be 0.4 ns (400 ps) when input A transitions from 0 to 1 causing output Z to transition from 0 to 1. In this situation, the IC test engine 150 can calculate that the given candidate defect has a scaled defect size for the cell instance (K,1) of 0.24 ns (240 ps), which is 20% greater than the corresponding scaled nominal delay of 0.2 ns (200 ps).

Moreover in this example, suppose that node slack data from the node slack report in the IC data 188 specifies that the cell instance (K,1) 136 has a node slack of 0.35 ns (350 ps) and that the cell instance (K,R) 136 has a node slack of 0.1 ns (100 ps). In this situation, the IC test engine 150 can calculate that the given candidate defect has a scaled defect size for the cell instance (K,1) of 0.24 ns (240 ps), which is 20% greater than the corresponding scaled nominal delay of 0.2 ns (200 ps). Moreover, in this situation, due to the respective node slack of 0.35 ns (350 ps) for the cell instance (K,1) 136, the given test pattern has a detectable delay size of 0.35 ns or more for this cell instance (K, 1) 136. That is, delays caused by the candidate defect of less than 0.35 ns (350 ps) are not detectable with the given test pattern. Accordingly, the IC test engine 150 can filter (remove) the given test pattern for cell instance (K,1) 136 because the scaled defect size for the cell instance (K,1) of 0.24 ns (240 ps) is less than the node slack of 0.35 ns (350 ps) in the IC data 188.

Additionally, continuing with the above example, the IC test engine 150 can calculate that the given candidate defect has a scaled defect size for the cell instance (K,R) 136 of 0.12 ns (120 ps), which is 20% greater than the corresponding scaled nominal delay of 0.1 ns (100 ps). In this situation, due to the respective node slack of 0.1 ns (100 ps) the cell instance (K,R) 136, the given test pattern has a detectable delay size of 0.1 ns (100 ps) or more for this cell instance (K,R) 136. Thus, the IC test engine 150 can include the given test pattern for the cell instance (K,R) 136 because the scaled defect size for the cell instance (K,R) 136 of 120 ps is greater than the node slack of 0.1 ns (100 ps) specified in the IC data 188.

The IC test engine 150 generates and outputs the cell-aware test patterns 196. The cell-aware test patterns 196 are employable by automatic test equipment (ATE) 198 to test the fabricated IC chip 104. In some examples, the cell-aware test patterns 196 are stored in the memory 116 and/or the ATE 198 prior to execution of the testing. The ATE 198 can alternatively be referred to as an IC chip tester or an IC chip tester machine. The ATE 198 can be implemented as a hardware device that is electrically coupled to pins on the fabricated IC chip 104. In the examples illustrated, such pins can be coupled to the interface 140 of the fabricated IC chip 104.

The cell-aware test patterns 196 employed by the ATE 198 contain stimuli to be applied to inputs and the expected values on the outputs of the fabricated IC chip 104. The ATE 198 is configured such that if the measured value by the ATE 198 is different from the expected value specified in the cell-aware test patterns 196, the ATE 198 stores the failure data. The failure data can be sent to the IC test engine 150 later to determine the cause of one or more failures in the fabricated IC chip 104. In situations where application of the cell-aware test patterns 196 indicates that the fabricated IC chip 104 is operating properly (e.g., within acceptable tolerances), the fabricated IC chip 104 can be approved for deployment. In situations where the application of the cell-aware test patterns indicates that the fabricated IC chip 104 is not operating properly (e.g., within tolerances), the fabricated IC chip 104 can be rejected, such that the fabricated IC chip is not deployed.

The cell-aware test patterns 196 generated by the IC test engine 150 vary considerably based on the architecture of the IC design 108 by the fabricated IC chip 104 and the specific environment in which the fabricated IC chip 104 is designed to operate. To accommodate such variety, the cell-aware test patterns 196 generated by the IC test engine 150 are tuned based on the fault rules file 158, data extracted from the SDF file 190 and node slack information extracted from the node slack report included in the IC data 188. Moreover, the cell-aware test patterns are based on the fault rules files 158 that include a value quantifying a delta delay, $Delay_A$, relative to a corresponding scaled nominal delay (which scaled nominal delay is based on a nominal delay of a corresponding fault rules file 158 and a propagation delay extracted from the SDF file 190) for each candidate defect that may cause a particular defect. By employing the SDD ATPG techniques to generate the cell-aware test patterns 196, the quality of test patterns is improved (relative to conventional ATPG techniques) because these patterns target small delay defects in cell instances 136 of the cells 132 using the longest possible path from a launch node to a capture node.

Figure 6:
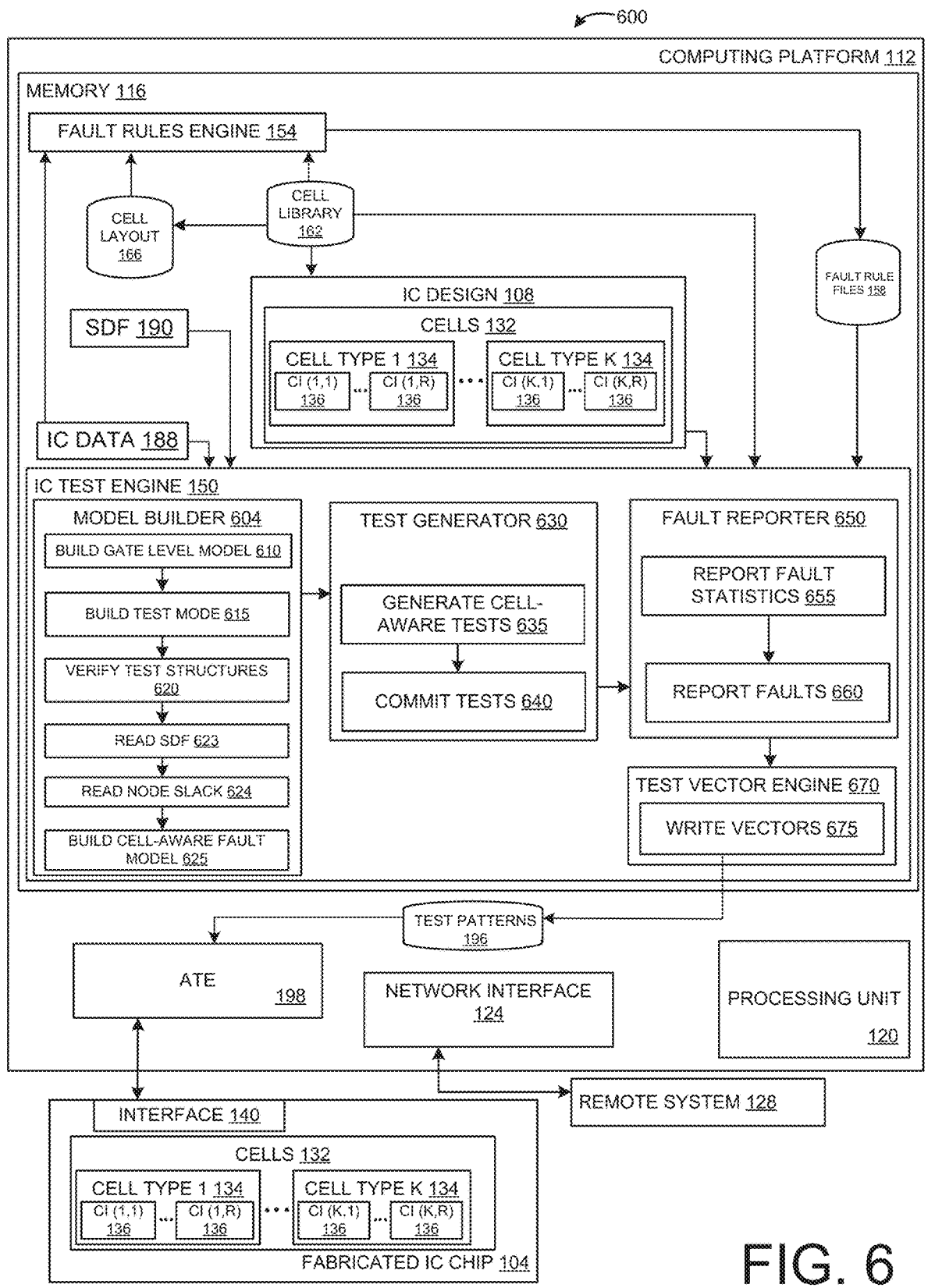
FIG. 6 illustrates another example of a system for testing a fabricated IC chip that is based on an IC design.

FIG. 6 illustrates a system 600 for testing the fabricated IC chip 104. The system 600 is similar to the system 100 of FIG. 1 with a detailed view and description of the IC test engine 150. Thus, for purposes of simplification of explanation, the same reference numbers are employed in FIGS. 1 and 6 to denote the same structure. Additionally, some reference numbers are not re-introduced. The IC design 108 can be stored in the memory 116 of the computing platform 112. The IC design 108 can be implemented, for example, as design specifications for an IC chip. The fabricated IC chip 104 represents a physical instantiation of the IC design 108, and the interface 140 can provide an interface for external systems to provide stimuli to the components of the fabricated IC chip, including the cells 132 of the fabricated IC chip 104.

The IC test engine 150 stored in the memory 116 is configured to employ SDD ATPG techniques to generate the cell-aware test patterns 196 for the fabricated IC chip 104 to ensure proper operation. More particularly, the IC test engine 150 generates the cell-aware test patterns 196 that are employable by the ATE 198 to test the fabricated IC chip 104. The ATE 198 is configured such that if the measured value by the ATE 198 is different from the expected value specified in the cell-aware test patterns 196, the ATE 198 stores the failure data. The failure data can be sent to the IC test engine 150 later to determine the cause of one or more failures in the fabricated IC chip 104

The IC test engine 150 can also operate in concert with the fault rules engine 154 stored in the memory 116. The fault rules engine 154 can be configured/programmed to generate fault rules files 158. In some examples, the fault rules engine 154 generates DDMs that each represent a user-readable format of a corresponding fault rules file 158. Each fault rule file 158 represents a set of fault rules for a particular cell type 134 that corresponds to a cell that is selected from a cell library 162. The cell library 162 can include, but is not limited to, data characterizing a physical layout of each of the K number of cell types 134 in the cells 132 of the IC design 108 and the fabricated IC chip 104. The cell library 162 can also include structural Verilog (.v), behavioral Verilog (.v) and timing models (.lib).

To generate the fault rule files 158, the fault rules engine 154 can read a cell layout 166 from the cell library 162. The cell layout 166 can characterize a physical layout for a particular cell type 134 extracted from the cell library 162. The fault rules engine 154 generates a particular fault rule file 158 of the fault rule files 158 based on the cell identified in the cell layout 166. Each fault rule file 158 can provide information similar to the information included in the DDM 400 described with respect to the given example. Thus, each of the fault rule files 158 can identify a numeric value quantifying a nominal delay, $Delay_{nom}$ of cell-aware test patterns and percentage values quantifying delta delays, $Delay_A$, for each candidate defect that may cause a transition delay.

Additionally, in some examples, IC data 188 characterizing selectable attributes of the IC design 108 can be provided to the fault rules engine 158 and the IC test engine 150. In some examples, the IC data 188 can be provided, for example, in response to user input. For instance, some portions of the IC data 188 can be generated during or after the IC design 108 is being generated. The IC data 188 can include, among other things, information for each cell type 134 included in the IC design 108, or some subset thereof. This information can include, for example, an input slew rate and output load for each of the K number of cell types 134 in the cells 132. The input slew rate and output load can be based, for example, on a-priori knowledge of delay paths in the IC design (e.g., as an average input slew rate and/or average output load for each cell type 134, or some subset thereof). The fault rules engine 154 can employ the IC data 188 to measure the nominal delay and the delta delay of each of the fault rules files 158 or some subset thereof. In situations where the input slew rate and output load are omitted for a cell type 134 (or each cell type 134), the fault rules engine 154 can employ default values to measure the nominal delay and the delta delay for the cell type 134.

The fault rules files 158 for each of the K number of cell types 134 of the cells 132 included in the IC design 108 are provided to the IC test engine 150 for the generation of cell-aware test patterns for the fabricated IC chip 104 using SDD transition ATPG techniques that consider path delays to individual cell instances 136 of the cells 132 of the IC design 108. Thus, test patterns generated with SDD ATPG techniques are timed transition test patterns that employ a longest possible path between a launch node and a capture node for a particular cell instance 136 to detect defects in the fabricated IC chip 104. In contrast to SDD ATPG techniques, other ATPG techniques may select the easiest sensitization and detection paths that can be found, and these paths often are the shortest paths. However, by selecting the longest possible paths through cell instances 136, the quality of the test patterns is improved by improving the probability that defects, particularly, SDDs, in the fabricated IC chip 104 will be detected.

Additionally, the memory 116 can also store an SDF file 190 for the IC design 108. The SDF file 190 can include delay information for each cell instance 136 of the cells 132 in the IC design 108. More specifically, the SDF file 190 includes delay information for each of the R number of cell instances 136 of each of the K number of cell types 134. The delay information provided by the SDF file 190 can include, but is not limited to a propagation delay employable to scale a nominal delay for test patterns.

The IC data 188 can also include a node slack report (e.g., a particular type of timing report) for the IC design 108. The node slack report included in the IC data 188 can contain slack information for each path in the IC design 108, such as a path from a source flop to another destination flop. The node slack report can include the slack on each cell instance 136 of each of the plurality of cell types 134 in the IC design 108.

Additionally, in some examples, the IC data 188 can include information quantifying a minimum defect size, a maximum defect size or a range of defect sizes. For instance, the IC data 188 could specify that the IC test engine 150 should test for defects that cause a delay of 800 ps or more (e.g., quantified as a minimum defect size). In other examples, this defect size information (minimum defect size, a maximum defect size or a range of defect sizes) can be omitted.

The IC test engine 150 can represent a plurality of software modules operating in an ordered sequence to generate the cell-aware test patterns using timed SDD ATPG techniques. The IC test engine 150 includes a model builder 604 that can build a model of the IC design 108 that is employable to generate the cell-aware test patterns to test the fabricated IC chip 104. To build the model of the IC design 108, the model builder 604 can execute model builder operations. More particularly, at 610, the model builder 604 builds a gate level model of the IC design 108. At 615, the model builder 604 builds a test mode. The build test mode reads test pin specifications and creates a test mode view given these test pin specifications. Such test pin specifications, among other things, can include scan input pin names, scan output pin names, test clock pin names, set/reset pin names and other constraints necessary to put the design in a test mode.

At 620, the model builder 604 verifies the presence of test structures in the gate level model of the IC design 108. The test structures represent scan and test circuitry present in the IC design 108 to facilitate the application of cell-aware test patterns to the fabricated IC chip 104. The operations at 620 also check if the IC design 108 complies with test design rules given the test constraints/specifications read in 615. For example, the operations at 620 can verify that the flops in the IC design 108 can be controlled by specified test clocks, and can verify that these test clocks can be controlled properly through primary input pins. Additionally, the operations at 620 can verify that set/reset to flops be controlled through primary input pins or are the flops are in an off state. Each test structure can be implemented, for example, in a similar manner to the circuit diagram 500 of FIG. 5A.

At 623, the model builder 604 reads the SDF file 190 to extract a propagation delay employable for test patterns for each cell instance 136 of the cells 132 in the fabricated IC chip 104 from the SDF file 190. At 624 the model builder 604 extracts (reads) the node slack for each of the cell instances 136 in the cells 132 of the fabricated IC chip 104 from the node slack report included in the IC data 188. The propagation delays and the node slack extracted from the SDF file 190 and the IC data 188, respectively are employable to generate test patterns that are tailored for the individual cell instances 136 of each cell type 134.

At 625, the model builder 604 can employ the fault rules files 158 and the gate level design to build a cell-aware fault model for the IC design 108. The cell-aware fault model includes candidate defects represented as shorts or opens identified by the fault rules engine 154. The cell-aware fault model built by the model builder 604 can be provided to a test generator 630 of the IC test engine 150.

The test generator 630 can execute test generation operations. More particularly, at 635, the test generator 630 can employ SDD ATPG techniques to generate cell-aware test patterns for the fabricated IC chip 104 based on the cell-aware fault model generated by the model builder 604. More specifically, the IC test engine 150 can examine the fault rules files 158 and the IC data 188 to generate a set of test patterns tailored for each of the R number of cell instances 136 of each of the K number of cell types 134 of the cells 132 in the IC design 108. The propagation delay extracted from the SDF file 190 for each cell instance 136 of each of the K number of cell types 134 of the cells 132 can be employed to determine a scaled nominal delay for test patterns for each respective cell instance 136. Moreover, the test generator 630 can generate a scaled defect delay for each candidate defect of each cell instance 136 of the K number of cell types 134 based on the scaled nominal delay and the delta delay (in percentage) included in respective fault rules files 158. The test patterns are generated based on candidate defects within boundaries of the cells 132 of the IC design 108. Additionally, employing SDD ATPG techniques allows the IC test engine 150 to generate the cell-aware test patterns targeting small delay defects in cell instances 136 of the cells 132 using the longest possible path between a launch node and a capture node corresponding to the respective cell instances 136.

As an example, suppose the fault rules files 158 specifies that a given test pattern for a given cell type 134 has a nominal delay of 0.3 ns (300 ps). In this situation, suppose that the SDF file 190 specifies that a cell instance 136 of the given cell type 134 has an input A to output Z propagation delay of 0.6 ns (600 ps) when input A transitions from 0 to 1 causing output Z to transition from 0 to 1 as well. The IC test engine 150 can determine that the cell instance 136 of the given cell type 134 has a scaled nominal delay of 0.6 ns (600 ps) and generate a cell-aware test pattern with the scaled nominal delay for the given cell instance 136 (rather than the nominal delay, $Delay_{nom}$ specified in the fault rules file 158 for the given cell type 134). Specifically, in this example the test generator 630 can generate cell-aware test patterns for the given cell instance 136 that sets the scaled nominal delay to 0.6 ns (600 ps). Similarly, continuing with this example, suppose a particular candidate defect specifies a delta delay, Delay of 5% (e.g., as characterized by the DDM 400 of FIG. 4), the IC test engine 150 can determined as scaled defect delay size for the particular candidate defect accordingly. For instance, in this example, the test generator 630 can set the scaled defect delay size to 0.63 ns (630 ps) for the particular candidate defect of the given cell instance 136, which is 5% greater than the scaled nominal delay of 0.6 ns (600 ps) specified for the given cell instance 136. More generally, for cell instances 136 of the given cell type 134, the test generator 630 can be configured to generate cell-aware test patterns for cell instances 136 of the given cell type 134 that test for the particular candidate defect that causes a transition delay of 5% or more relative to the scaled nominal delay for the cell instance 136. In this manner, the cell-aware test patterns are tuned for the particular characteristics of cell instances 136 in the IC design 108.

At 640 the test generator 630 commits a subset of the cell-aware test patterns to test the fabricated IC chip 104 based on the IC data 188. As noted, in some examples, the IC data 188 can include information characterizing a minimum defect delay size, a maximum defect delay size or a range of defect delay sizes. For instance, the IC data 188 can specify that the fabricated IC chip 104 is to be tested for defects that cause a transition delay of 0.5 ns (500 ps) or more (e.g., as the minimum defect delay size). The minimum defect delay size, the maximum defect delay size or the range of defect delay sizes can be based, for example, on the environment of implementation for the fabricated IC chip 104. In some examples of this situation, the test generator 630 can filter (remove) test patterns that test for candidate defects that cause a transition delay of less than 0.5 ns (500 ps). As an alternate approach, the filtering can be executed a 625. In this situation, particular candidate defects that are not detectable within the minimum defect delay size (e.g., 0.5 ns (500 ps) in the present example) are removed from the cell-aware fault model 625. Such filtering of test patterns and/or candidate defects reduces the number of cell-aware test patterns needed to test the fabricated IC chip 104 such that a subset of the test patterns generated at 535 are employed as the cell-aware test patterns 196 to test the fabricated IC chip 104. Alternatively, as noted, in some examples, the IC data 188 may omit the information related to defect sizes (the minimum defect size the maximum defect size and the range of defect sizes). In such a situation, during operations at 640, the IC test generator 630 can employ the nominal delay from the fault rule files 158, the propagation delay from the SDF file 190, a path delay calculated from the SDF file and node slack information for each cell instance 136 to filter undetectable defects automatically.

To filter the test patterns, the test generator 630 can calculate a detectable defect size for each cell instance 136 of each cell type 134. The detectable defect size can be based, for example, on the node slack extracted from the node slack report included in the IC data 188 for each respective cell instance 136. As an example of the impact of filtering test patterns based on information included in the node slack timing report specified in the IC data 188, suppose that the SDF file 190 specifies that cell instance (1,1) 136 has an input A to output Z propagation delay of 0.1 ns (100 ps) and that cell instance (1,R) 136 has an input A to output Z propagation delay of 0.2 ns (200 ps) when input A transitions from 0 to 1 causing output Z to transition from 0 to 1 as well. Further, suppose that the fault rules file 158 for cell type 1 134 has a nominal delay, Delay$_{nom}$ of 0.2 ns (200 ps) and delta delay, Delay$_A$, of 30% for a given candidate defect which can be detected by a given test pattern requiring input A to transition from 0 to 1 and defect free output Z to transition from 0 to 1. Based on the propagation delay specified in the SDF file 190 for the cell instance (1,1) 136, the scaled nominal delay for the cell instance (1,1) 136 is determined to be 0.1 ns (100 ps) and the scaled nominal delay for the cell instance (1,R) 136 is determined to be 0.2 ns (200 ps) when input A transitions from 0 to 1 causing output Z to transition from 0 to 1. In this situation, the IC test engine 150 can calculate that the given candidate defect has a scaled defect size for the cell instance (1,1) of 0.13 ns (130 ps), which is 30% greater than the corresponding scaled nominal delay of 0.1 ns (100 ps).

Additionally, suppose that the IC data 188 specifies that the cell instance (1,1) 136 has a node slack of 0.4 ns (400 ps) and that the cell instance (1,R) 136 has a node slack of 0.2 ns (200 ps). In this situation, the IC test engine 150 can calculate that the given candidate defect has a scaled defect size for the cell instance (1,1) of 0.13 ns (130 ps), which is 30% greater than the corresponding scaled nominal delay of 0.2 ns (200 ps). Moreover, in this situation, due to the respective node slack of 0.4 ns (400 ps) for the cell instance (1,1) 136, the given test pattern has a detectable delay size of 0.4 ns or more for this cell instance (1,1) 136. That is, delays caused by the candidate defect of less than 0.4 ns (400 ps) are not detectable with the given test pattern. Accordingly, the IC test engine 150 can filter (remove) the given test pattern for cell instance (1,1) 136 because the scaled defect size for the cell instance (1,1) of 0.13 ns (130 ps) is less than the node slack of 0.4 ns (400 ps) in the IC data 188.

Conversely, continuing with the above example, the IC test engine 150 can calculate that the given candidate defect has a scaled defect size for the cell instance (1,R) 136 of 0.26 ns (260 ps), which is 30% greater than the corresponding scaled nominal delay of 0.2 ns (200 ps). In this situation, due to the respective node slack of 0.2 ns (200 ps) the cell instance (1,R) 136, the given test pattern has a detectable delay size of 0.2 ns (200 ps) or more for this cell instance (1,R) 136. Thus, the IC test engine 150 can include the given test pattern for the cell instance (1,R) 136 because the scaled defect size for the cell instance (1,R) 136 of 260 ps is greater than the node slack of 0.2 ns (200 ps) specified in the IC data 188.

The IC test engine 150 can include a fault reporter 650 that can execute operations related to fault reporting. More particularly, at 655 the fault reporter 650 can generate report fault statistics that characterize, for example data related to the cell-aware test patterns applied to the fabricated IC chip 104. Additionally, at 660, the fault reporter 650 can generate fault reports for the fault statistics and cell defect statistics.

A test vector engine 670 of the IC test engine 150 can convert the cell-aware test patterns into a format consumable by the ATE 198. In particular, at 675, the test vector engine 670 can write vectors that implement the cell-aware test patterns 196 that are employable by the ATE 198. The cell-aware test patterns 196 can be stored, for example, on the memory 116 and/or at the ATE 198.

The ATE 198 stimulates inputs of the fabricated IC chip as dictated by the cell-aware test patterns 196 and the ATE 198 is configured to compare a measured output of the fabricated IC chip 104 with expected values stored in the cell-aware test patterns 196. In case of mismatch, a failure log is generated by the ATE 198. At a subsequent time, this failure log can be converted into a format readable by the IC test engine 150 to analyze the cause of failures at the fabricated IC chip 104.

The cell-aware test patterns generated by the IC test engine 150 vary considerably based on the architecture of the IC design 108 by the fabricated IC chip 104 and the specific environment in which the fabricated IC chip 104 is designed to operate. To accommodate such variety, the cell-aware test patterns generated by the IC test engine 150 are tailored (e.g., by scaling the nominal delay and calculating a scaled defect size for candidate defects in the corresponding fault rules file 158) based on data extracted from the SDF file 190. In this manner, in addition to testing for static defects, the cell-aware test patterns implemented by the write vectors can test for specific defects that are within instantiated versions of the cells 132 of the fabricated IC chip 104. Additionally, by employing the SDD ATPG techniques, the quality of the resultant cell-aware test patterns 196 is improved. In particular, the cell-aware test patterns 196, when employed by the ATE 198, employ a longest possible path between launch nodes and capture nodes for each cell instance 136 to increase the probability that small delay defects in cell instances 136 are detected in the fabricated IC chip 104.

Figure 7:
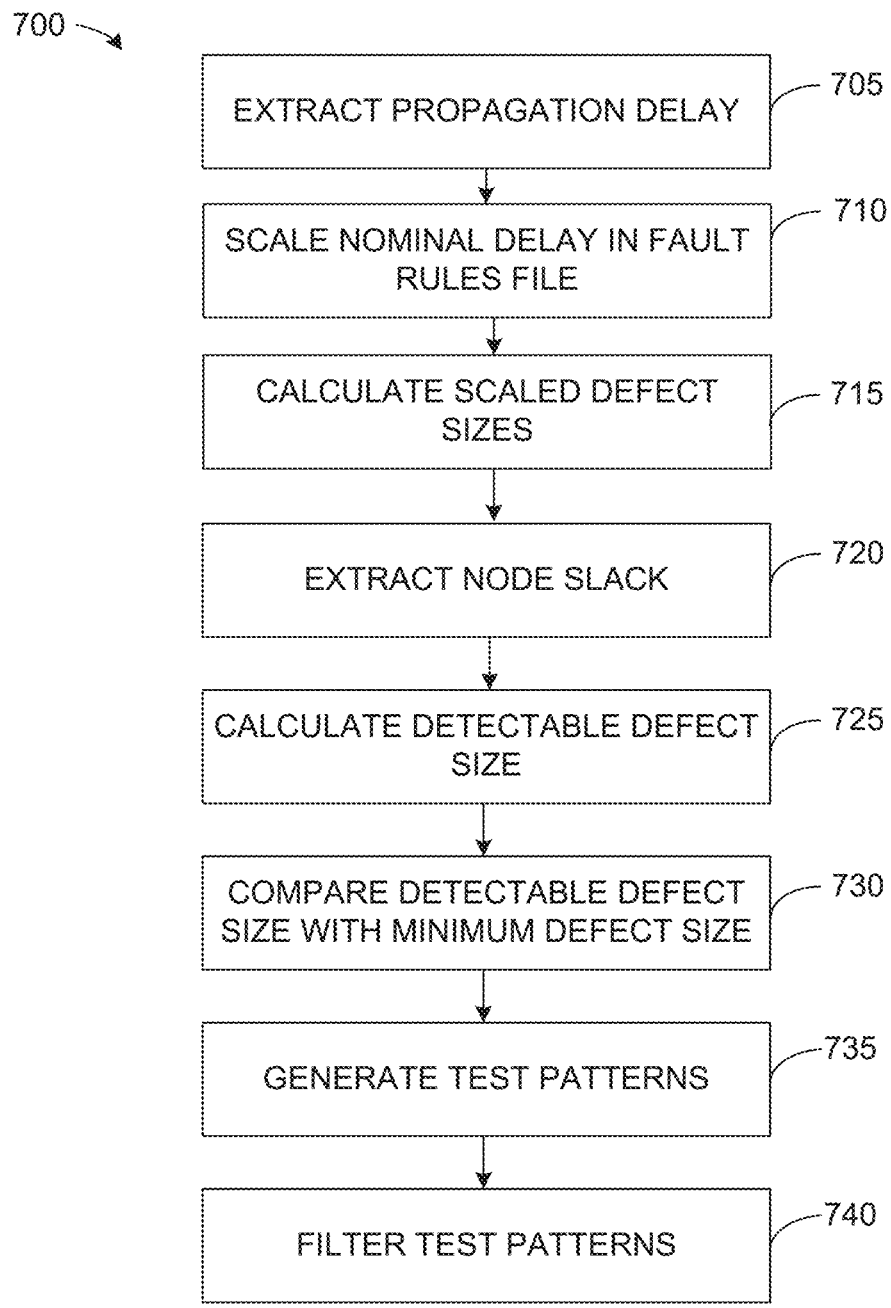
FIG. 7 illustrates a flowchart of an example method for generating a portion of test patterns for a fabricated IC chip.

In view of the foregoing structural and functional features described above, example methods will be better appreciated with reference to FIG. 7. While, for purposes of simplicity of explanation, the example method of FIG. 7 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 7 illustrates a flowchart of an example method 700 for generating a portion of test patterns for testing a fabricated IC chip, such as the fabricated IC chip 104 of FIG. 1. More particularly, the method 700 describes operations for generating a set of test patterns for a given cell instance of a given cell type of an IC design (e.g., the IC design 108 of FIG. 1) for the fabricated IC chip. The method 700 can be executed, for example by an IC test engine, such as the IC test engine 150 of FIG. 1. At 705, the IC test engine can extract a propagation delay for the given cell instance of the given cell type from an SDF file (e.g., the SDF file 190 of FIG. 1) for the IC design.

At 710, the IC test engine can scale a nominal delay quantified in a fault rules file associated with the given cell type with the extracted propagation delay for the given cell instance. At 715, the IC test engine can calculate a scaled defect size for each of a plurality of candidate defects of the given cell type based on the scaled nominal delay and on a delta delay quantified in the fault rules file for each respective candidate defect and the scaled nominal delay.

At 720, the IC test engine can extract node slack information for the given cell instance 136 from a node slack report that can be included in IC data (e.g., the IC data 188 of FIG. 1). The node slack information for the given cell instance is based on a worst slack of a timing path through the given cell instance. At 725, the IC test engine can calculate a detectable defect size for each candidate defect of the given cell instance based on a respective scaled defect size and a node slack extracted from the SDF file for the given cell instance. At 730, the IC test engine can compare the detectable defect size with the node slack information for the given cell instance and remove candidate defects for generation of test patterns with a detectable defect size that is less than a corresponding slack. At 735, the IC test engine can generate test patterns for each of the plurality of candidate defects of the given cell instance based on the scaled nominal delay, the scaled defect size for each of the candidate defects of the given cell type and the node slack information for the given cell instance. The cell-aware test patterns generated at 735 employ SDD ATPG techniques that generate test patterns using a longest possible path to detect small delay defects in the given cell instance 136. Furthermore, in some examples, at 740 the IC test engine can filter/remove test patterns from the set of test patterns for the IC chip with a detectable defect size that is less than the corresponding node slack based on the comparison executed at 730.

Figure 8:
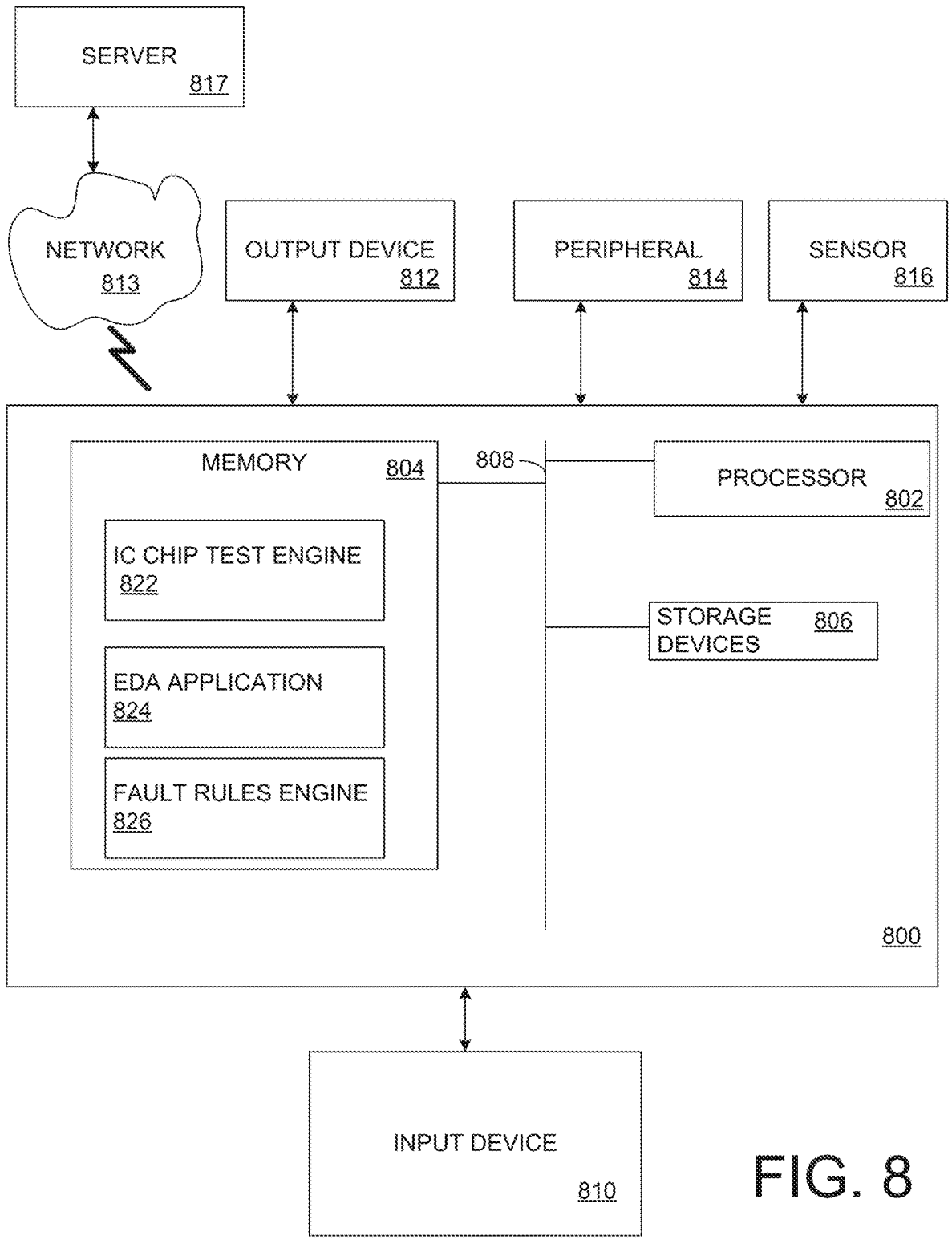
FIG. 8 illustrates an example of a computing system employable to execute an IC test engine and a fault rules engine.

The examples herein may be implemented on virtually any type of computing system regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory and input and output device(s) to perform one or more embodiments. As shown in FIG. 8, the computing system 800 can include a computer processor 802, associated memory 804 (e.g., RAM), cache memory, flash memory, etc.), one or more storage devices 806 (e.g., a solid state drive, a hard disk drive, an optical drive such as a compact disk (CD) drive or digital versatile disk (DVD) drive, a flash memory stick, etc.) and numerous other elements and functionalities. The computer processor 802 may be an IC chip for processing instructions. For example, the computer processor may be one or more cores, or micro-cores of a processor. Components of the computing system 800 can communicate over a data bus 808.

The computing system 800 may also include an input device 810, such as any combination of one or more of a touchscreen, keyboard, mouse, microphone, touchpad, electronic pen, or any other input device. Further, the computing system 800 can include an output device 812, such as one or more of a screen (e.g., light emitting diode (LED) display, an organic light emitting diode (OLED) display, a liquid crystal display (LCD), a plasma display, touchscreen, cathode ray tube (CRT) monitor, projector, or other display device), a printer, external storage, or any other output device. In some examples, such as a touch screen, the output device 812 can be the same physical device as the input device 810. In other examples, the output device 812 and the input device 810 can be implemented as separate physical devices. The computing system 800 can be connected to a network 813 (e.g., LAN, a wide area network (WAN) such as the Internet, a mobile network, or any other type of network) via a network interface connection (not shown). The input device 810 and output device(s) 812 can be connected locally and/or remotely (e.g., via the network 813) to the computer processor 802, the memory 804 and/or the storage devices 806. Many different types of computing systems exist, and the aforementioned input device 810 and the output device 812 can take other forms. The computing system 800 can further include a peripheral 814 and a sensor 816 for interacting with the environment of the computing system 800 in a manner described herein.

Software instructions in the form of computer readable program code to perform embodiments disclosed herein can be stored, in whole or in part, temporarily or permanently, on a non-transitory computer readable medium such as a CD, DVD, storage device, a diskette, a tape, flash memory, physical memory, or any other computer readable storage medium. Specifically, the software instructions can correspond to computer readable program code that when executed by a processor, is configured to perform operations disclosed herein. The computing system 800 can communicate with a server 817 via the network 813.

The memory 804 can include an IC test engine 822 to test an IC design that is instantiated as a fabricated IC chip. The IC design can be generated, for example, by an EDA application 824. The memory 804 can also include a fault rules engine 826 for generating fault rules files and/or DDMs to facilitate the testing of the fabricated IC chip.

Further, one or more elements of the aforementioned computing system 800 can be located at a remote location and connected to the other elements over the network 813. Additionally, some examples can be implemented on a distributed system having a plurality of nodes, where each portion of an embodiment can be located on a different node within the distributed system. In one example, the node corresponds to a distinct computing device. Alternatively, the node can correspond to a computer processor with associated physical memory. The node can alternatively correspond to a computer processor or micro-core of a computer processor with shared memory and/or resources.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on". Additionally, where the disclosure or claims recite "a," "an," "a first," or "another" element, or the equivalent thereof, it should be interpreted to include one or more than one such element, neither requiring nor excluding two or more such elements.

What is claimed is:

1. A non-transitory machine-readable medium having machine-readable instructions, the machine-readable instructions comprising:
   a fault rules engine that generates a plurality of fault rules files, wherein each of the fault rules files is associated with a respective cell type of a plurality of cell types in an integrated circuit (IC) design, and each fault rules file of the plurality of fault rules files comprises data quantifying a nominal delay for a given two-cycle test pattern of a set of two-cycle test patterns and data quantifying a delta delay for the given two-cycle test pattern corresponding to a given candidate defect of a plurality of candidate defects of a given cell type of the plurality of cell types in the IC design; and
   an IC test engine that:
      extracts an input to output propagation delay for each cell instance of each of the plurality of cell types in the IC design from a standard delay format (SDF) file for the IC design;
      extracts node slack information for each cell instance of each of the plurality of cell types of the IC design from a node slack report for the IC design;
      employs a given input to output propagation delay of the extracted input to output propagation delays for a given cell instance of the given cell type of the plurality of cell types for test patterns for the given cell instance to scale a nominal delay quantified in a given fault rules file of the plurality of fault rules files associated with the given cell type to determine a scaled nominal delay for the given cell instance and calculates a scaled defect size for each candidate defect identified in the given fault rules file of the plurality of fault rules files based on the scaled nominal delay for the given cell instance, the given input to output propagation delay for the given cell instance and on a delta delay specified for the given candidate defect quantified in the given fault rules file; and
      generates cell-aware test patterns for each cell instance of each cell type in the IC design based on the plurality of fault rules files, the extracted input to output propagation delay for each respective cell instance and the node slack information extracted for each cell instance to test a fabricated IC chip that is based on the IC design for defects corresponding to a subset of the plurality of candidate defects characterized in the plurality of fault rules files, wherein each cell-aware test pattern of the cell-aware test patterns is configured to sensitize and propagate a transition along the longest possible path to test small delay defects in each respective cell instance of the fabricated IC chip.

2. The medium of claim 1, wherein the IC test engine calculates a detectable defect size for the given candidate defect for the given cell instance based on the scaled defect size of the given candidate defect and on the node slack information associated with the given cell instance.

3. The medium of claim 1, wherein the IC test engine selects the longest possible path between a launch node and a capture node for cell instances in the IC design to generate test patterns for a subset of cell instances of the fabricated IC chip.

4. The medium of claim 3, wherein the node slack information for each cell instance of each of the plurality of cell types is based on a worst slack of a timing path through each respective cell instance.

5. The medium of claim 1, wherein the IC test engine calculates a detectable defect size of each candidate defect of each cell instance of the plurality of cell types based on the extracted node slack information for each respective cell instance.

6. The medium of claim 5, wherein the IC test engine removes test patterns for candidate defects and/or removes candidate defects for test pattern generation that have a detectable defect size less than a corresponding slack defined in the node slack information extracted for each cell instance.

7. A system comprising:
   a non-transitory memory that stores machine-readable instructions; and
   a processing unit that accesses the memory and executes the machine-readable instructions, the machine-readable instructions comprising:
   an IC test engine that:
      extracts an input to output propagation delay for each cell instance of each of a plurality of cell types in an integrated circuit (IC) design from a standard delay format (SDF) file for the IC design;
      extracts node slack information for each cell instance of each of the plurality of cell types of the IC design from a node slack report for the IC design; and
      employs small delay defect (SDD) automatic test pattern generation (ATPG) techniques to generate cell-aware test patterns for each cell instance of each cell type in the IC design based on a plurality of fault rules files, the extracted input to output propagation delay for each respective cell instance and the extracted node slack information for each cell instance to test a fabricated IC chip that is based on the IC design for defects corresponding to a subset of a plurality of candidate defects characterized in the plurality of fault rules files, wherein each cell-aware test pattern of the cell-aware test patterns is configured to sensitize and propagate a transition along the longest possible path to test small delay defects in each respective cell instance of the fabricated IC chip, wherein each of the fault rules files is associated with a respective cell type of a plurality of cell types in an IC design of the fabricated IC chip, and each fault rules file of the plurality of fault rules files comprises data quantifying a nominal delay for a given two-cycle test pattern of a set of two-cycle test patterns and data quantifying a delta delay for the given two-cycle test pattern corresponding to a given candidate defect of a plurality of candidate defects for a given cell type of the plurality of cell types in the IC design;
      employs a given extracted input to output propagation delay of the extracted input to output propagation delays for a given cell instance of the given cell type for generating test patterns for the given cell instance to scale a nominal delay quantified in a given fault rules file of the plurality of fault rules files associated with the given cell type to determine a scaled nominal delay for the given cell instance; and calculates a scaled defect size for each candidate defect identified in the given fault rules file of the plurality of fault rules files, wherein the scaled defect size of a given candidate defect is based on the given extracted input to output propagation delay for the given cell instance and on a delta delay specified for the given candidate defect quantified in the given fault rules file.

8. The system of claim 7, wherein the IC test engine calculates a detectable defect size for the given candidate defect for the given cell instance based on the scaled defect size of the given candidate defect and on the node slack information associated with the given cell instance.

9. The system of claim 7, wherein the IC test engine selects the longest possible path between a launch node and a capture node for cell instances of the IC design to generate test patterns for a subset of cell instances of the fabricated IC chip.

10. The system of claim 7, wherein the node slack information for each cell instance of each of the plurality of cell types is based on a worst slack of a timing path through each respective cell instance.

11. The system of claim 7, wherein the IC test engine removes test patterns for candidate defects and/or removes candidate defects for test pattern generation that have a detectable defect size that is less than a corresponding slack defined in the node slack information extracted for each cell instance.

12. A method for generating a set of test patterns for testing a fabricated integrated circuit (IC) chip, the method comprising:

extracting, by an IC test engine, an input to output propagation delay for a given cell instance of a given cell type from an SDF file for an IC design for the fabricated IC chip;

extracting, by the IC test engine, node slack information for the given cell instance from a node slack report;

scaling, by the IC test engine, a nominal delay quantified in a fault rules file associated with the given cell type with the input to output propagation delay to determine a scaled nominal delay for the given cell instance;

calculating, by the IC test engine, a scaled defect size for each of a plurality of candidate defects of the given cell type based on the scaled nominal delay and a delta delay quantified by the fault rules file for each respective candidate defect and the scaled nominal delay; and generating cell-aware test patterns for each of the plurality of candidate defects of the given cell instance based on the scaled nominal delay, the scaled defect size and the node slack information of the given cell instance, wherein each cell-aware test pattern of the cell-aware test patterns is configured to sensitize and propagate a transition along the longest possible path to test small delay defects in the fabricated IC chip.

13. The method of claim 12, wherein the generating further comprises selecting the longest possible path between a launch node and a capture node for the given cell instance.

14. The method of claim 13, wherein each candidate defect of the plurality of candidate defects is modeled as an open or a short in a circuit design for the given cell.

15. The method of claim 14, further comprising:

calculating a detectable defect size for each candidate defect of the plurality of candidate defects for the given cell instance based on a respective scaled defect size and the node slack information extracted from the node slack report for the given cell instance; and removing test patterns from the set of test patterns for the IC chip and/or removing candidate defects from test pattern generation for candidate defects with a detectable defect size that is less than a corresponding slack defined in the node slack information extracted for each cell instance.

\* \* \* \* \*